US012575354B2

(12) United States Patent
Kawarazaki

(10) Patent No.: US 12,575,354 B2
(45) Date of Patent: Mar. 10, 2026

(54) SUBSTRATE PROCESSING METHOD AND SUBSTRATE PROCESSING APPARATUS

(71) Applicant: SCREEN Holdings Co., Ltd., Kyoto (JP)

(72) Inventor: Hikaru Kawarazaki, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 225 days.

(21) Appl. No.: 18/361,328

(22) Filed: Jul. 28, 2023

(65) Prior Publication Data

US 2024/0038544 A1 Feb. 1, 2024

(30) Foreign Application Priority Data

Jul. 29, 2022 (JP) ................................. 2022-122034

(51) Int. Cl.
 *H01L 21/32* (2006.01)
 *H01L 21/3213* (2006.01)
(52) U.S. Cl.
 CPC .............................. *H01L 21/32134* (2013.01)
(58) Field of Classification Search
 CPC ........... H01L 21/32134; H01L 21/6708; H01L 21/67115; H01L 21/02244; H01L 21/02255; H01L 21/30604; H01L 21/31111; H01L 21/677
 USPC ........................................................ 438/754
 See application file for complete search history.

(56) References Cited

U.S. PATENT DOCUMENTS

| | | | |
|---|---|---|---|
| 9,611,152 | B2 | 4/2017 | Abboudi et al. |
| 10,892,177 | B2 | 1/2021 | Iwasaki et al. |
| 2002/0081847 | A1 | 6/2002 | Jo et al. |
| 2005/0266605 | A1 | 12/2005 | Kawakami |

(Continued)

FOREIGN PATENT DOCUMENTS

| | | |
|---|---|---|
| JP | 2000-091331 A | 3/2000 |
| JP | 2021-114569 A | 8/2021 |

(Continued)

OTHER PUBLICATIONS

Pacco, Antoine, et al., "Etching of molybdenum via a combination of low-temperature ozone oxidation and wet-chemical oxide dissolution", J. Vac. Sci. Technol. A41, 032601 (2023) pp. 1-8.

(Continued)

*Primary Examiner* — Duy Vu N Deo
(74) *Attorney, Agent, or Firm* — OSTROLENK FABER LLP

(57) ABSTRACT
A substrate processing method includes a first oxidation step of heating a substrate at a first temperature by irradiation of light of a first intensity while supplying an oxygen gas or an ozone gas to the substrate, a first etching step of supplying an etching liquid to the substrate to make a surface layer of a molybdenum film that changed to molybdenum trioxide dissolve in the etching liquid, a second oxidation step of heating the substrate at a second temperature by irradiation of light of a second intensity while supplying the oxygen gas or the ozone gas to the substrate, and a second etching step of supplying the etching liquid to the substrate to make the surface layer of the molybdenum film that changed to the molybdenum trioxide dissolve in the etching liquid.

9 Claims, 6 Drawing Sheets

Oxidation

Etching

(56) References Cited

U.S. PATENT DOCUMENTS

| | | | |
|---|---|---|---|
| 2007/0159057 A1* | 7/2007 | Kaneko | H01J 29/864 |
| | | | 313/292 |
| 2010/0279439 A1 | 11/2010 | Shah et al. | |
| 2013/0303414 A1 | 11/2013 | Ramm et al. | 508/108 |
| 2016/0013438 A1 | 1/2016 | Im et al. | |
| 2018/0294187 A1 | 10/2018 | Thombare et al. | |
| 2019/0228966 A1 | 7/2019 | Wang et al. | |
| 2019/0361001 A1* | 11/2019 | Dhanekar | A61B 5/082 |
| 2020/0303207 A1 | 9/2020 | Higuchi et al. | |
| 2021/0398817 A1 | 12/2021 | Takezawa et al. | |
| 2022/0059325 A1 | 2/2022 | Jin et al. | |
| 2022/0084838 A1 | 3/2022 | Zhang et al. | |
| 2022/0148882 A1* | 5/2022 | Abel | H01L 21/30604 |
| 2022/0148885 A1 | 5/2022 | Abel et al. | |
| 2023/0093011 A1 | 3/2023 | Fischer et al. | |
| 2023/0207328 A1 | 6/2023 | Musselwhite et al. | |
| 2024/0038544 A1 | 2/2024 | Kawarazaki | |

FOREIGN PATENT DOCUMENTS

| | | | |
|---|---|---|---|
| JP | 2022-509816 A | 1/2022 | |
| JP | 2022-516772 A | 3/2022 | |
| KR | 10-2021-0122459 A | 10/2021 | |
| KR | 10-2021-0157333 A | 12/2021 | |
| TW | 202147431 A | 12/2021 | |
| TW | 202205361 A | 2/2022 | |
| WO | WO 2014/108841 A1 | 7/2014 | |
| WO | WO 2015/108842 A1 | 7/2015 | |
| WO | WO-2020112237 A1 * | 6/2020 | ....... H01L 21/76825 |
| WO | WO 2022/179680 A1 | 9/2022 | |

OTHER PUBLICATIONS

Guimond, S., et al., "Well-Ordered Molybdenum Oxide Layers on Au(111): Preparation and Properties", The Journal of Physical Chemistry C, 2013, 117, 8746-8757.

McEvoy, Todd M., et al., "Electrochemical Preparation of Molybdenum Trioxide Thin Films: Effect of Sintering on Electrochromic and Electroinsertion Properties", Langmuir 2003, 19, 4316-4326.

Zeng, H.C., "Chemical Etching of Molybdenum Trioxide: A New Tailor-Made Synthesis of MoO3 Catalysts", Inorganic Chemistry 1998, 37, 1967-1973.

Diskus, Madeleine, et al.: "Growth of thin films molybdenum oxide by atomic layer deposition", Journal of Materials Chemistry, 2011, 21, 705-710.

Maruyama, Toshio, et al.: "Electrochromic Properties of Molybdenum Trioxide Thin Films Prepared by Chemical Vapor Deposition", J. Electrochem. Soc., vol. 142, No. 5, May 1995, pp. 1644-1647.

Epifani, Maruo, et al.: "Synthesis and Characterization of MoO 3 Thin Films and Powders from a Molybdenum Chloromethoxide", Chem. Mater. 2004, 16, 5495-5501.

Yanping, Li, et al.: "A simple synthesis method to prepare a molybdenum oxide hole-transporting layer for efficient polymer solar cells", RSC Adv. 2017, 7, 7890.

Antoine Pacco, et al.: "Controlled ALE-type recess of molybdenum for future logic and memory applications," 2021 IEEE International Interconnect Technology Conference, Electronic ISBN: 978-1-7281-7632-1.

* cited by examiner

Oxidation

Etching

|  | Cycle No | 1 | 2 | 3 | 4 | 5 | 6 | 7 | 8 | 9 | 10 |
|---|---|---|---|---|---|---|---|---|---|---|---|
|  | Case 1 | H | H | H | H | H | L | L | L | L | L |
|  | Case 2 | L | L | L | L | L | H | H | H | H | H |
|  | Case 3 | H | L | H | L | H | L | H | L | H | L |
|  | Case 4 | H | L | H | L | L | H | L | L | L | H |
|  | Case 5 | H | L | H | L | L | H | L | H | L | L |

TB

SUBSTRATE PROCESSING METHOD AND SUBSTRATE PROCESSING APPARATUS

CROSS REFERENCE TO RELATED APPLICATIONS

This application claims the benefit of priority to Japanese Patent Application No. 2022-122034 filed on Jul. 29, 2022. The entire contents of this application are hereby incorporated herein by reference.

BACKGROUND OF THE INVENTION

1. Field of the Invention

The present invention relates to a substrate processing method and a substrate processing apparatus that process a substrate. Examples of substrates include a semiconductor wafer, a substrate for a flat panel display (FPD) such as a liquid crystal display and an organic electroluminescence (organic EL) display, a substrate for an optical disc, a substrate for a magnetic disc, a substrate for a magneto-optical disc, a substrate for a photomask, a ceramic substrate, a substrate for a solar cell, and the like.

2. Description of Related Art

Japanese Translation of International Application (Kohyo) No. 2022-509816 disclose that forming a molybdenum oxide portion by oxidizing a molybdenum layer using oxygen ion implantation or oxygen plasma doping and that removing the molybdenum oxide portion from a substrate while leaving a non-oxidized molybdenum layer on the substrate by performing wet etching that supplies a liquid such as an ammonia solution, etc., to the substrate. Although Japanese Translation of International Application (Kohyo) No. 2022-509816 discloses the oxidizing of the molybdenum layer by oxygen ion implantation or oxygen plasma doping, it does not disclose oxidizing of the molybdenum layer by a method other than these. If it is desired to oxidize the molybdenum layer by a method other than the above, such a need cannot be answered by the disclosure of Japanese Translation of International Application (Kohyo) No. 2022-509816.

SUMMARY OF THE INVENTION

A preferred embodiment of the present invention provides a substrate processing method including a first oxidation step that includes a first gas supplying step of supplying an oxygen gas or an ozone gas to a substrate and a first heating step of irradiating the substrate with light of a first intensity to heat the substrate at a first temperature and that changes a surface layer of a molybdenum film formed on the substrate to molybdenum trioxide without changing a portion other than the surface layer of the molybdenum film to the molybdenum trioxide by performing the first gas supplying step and the first heating step at the same time, a first etching step of supplying an etching liquid to the substrate to make the surface layer that changed to the molybdenum trioxide in the first oxidation step dissolve in the etching liquid while leaving, on the substrate, the portion other than the surface layer of the molybdenum film, a second oxidation step that includes a second gas supplying step of supplying the oxygen gas or the ozone gas to the substrate and a second heating step of irradiating the substrate with light of a second intensity stronger or weaker than the first intensity to heat the substrate at a second temperature higher or lower than the first temperature and that changes the surface layer of the molybdenum film to the molybdenum trioxide without changing the portion other than the surface layer of the molybdenum film to the molybdenum trioxide by performing the second gas supplying step and the second heating step at the same time before or after the first oxidation step and the first etching step, and a second etching step of supplying the etching liquid to the substrate to make the surface layer that changed to the molybdenum trioxide in the second oxidation step dissolve in the etching liquid while leaving, on the substrate, the portion other than the surface layer of the molybdenum film.

By this method, the substrate is heated by irradiating the substrate with light. Further, the oxygen gas or the ozone gas is supplied to the substrate while irradiating the substrate with light. Thereby, oxygen atoms contained in the oxygen gas or the ozone gas bond with molybdenum and the surface layer of the molybdenum film changes to molybdenum trioxide. Thereafter, the etching liquid is supplied to the substrate. The molybdenum trioxide dissolves in the etching liquid. Therefore, the surface layer of the molybdenum film that has changed to the molybdenum trioxide is etched while the portion other than the surface layer of the molybdenum film that has not changed to the molybdenum trioxide remains on the substrate.

A thickness of the molybdenum oxide film that is formed by the change to the molybdenum trioxide depends on a temperature of the substrate when the oxygen gas or the ozone gas is being supplied. For example, when the temperature of the substrate is raised, the thickness of the molybdenum oxide film increases and a thickness of the molybdenum film decreases. If, when the surface layer of the molybdenum film is oxidized a plurality of times, the substrate is heated at a high temperature each time, although a rate at which the molybdenum film thins increases, it is difficult to control the thickness of the molybdenum film finely. On the other hand, if the substrate is heated at a low temperature each time, although the thickness of the molybdenum film can be controlled finely readily, the rate at which the molybdenum film thins decreases.

With the present preferred embodiment, when the surface layer of the molybdenum film is to be oxidized, the temperature of the substrate is changed by changing an intensity of light irradiated on the substrate. Therefore, in comparison to the case where the substrate is heated at a high temperature each time, the thickness of the molybdenum film can be controlled finely. In addition, in comparison to the case where the substrate is heated at a low temperature each time, the rate at which the molybdenum film thins can be increased. Thereby, the molybdenum film can be thinned in a shorter time while maintaining dimensional precision of the molybdenum film.

The oxygen gas and the ozone gas are oxygen-atom-containing gases that contains oxygen atoms. The supplying of the oxygen-atom-containing gas to the substrates may be performed by filling the oxidation space, in which the substrate is disposed, with the oxygen-atom-containing gas or by discharging the oxygen-atom-containing gas inside the oxidation space. In the latter case, the oxygen-atom-containing gas may fill the oxidation space or a gas other than the oxygen-atom-containing gas may be present in the oxidation space. That is, as long as an amount of oxygen atoms that is sufficient to change the molybdenum to the molybdenum trioxide is supplied to surfaces of the molybdenum films, the oxygen-atom-containing gas may be supplied to the substrates in any way. The light (electromagnetic waves, to be precise) irradiated on the substrate may be visible light rays (electromagnetic waves of a wavelength within a range of 380 to 800 nm) or invisible light rays (electromagnetic waves of a wavelength outside the above-mentioned range) or may include both visible light rays and invisible light rays.

In the preferred embodiment, at least one of the following features may be added to the substrate processing method.

At least one of the first heating step and the second heating step is a step of irradiating the substrate with light emitted from an LED (light emitting diode) lamp.

By this method, the substrate is heated by irradiating the substrate with light emitted from the LED lamp. Therefore, in comparison to a case of heating the substrate with a hotplate, that is, in comparison to a case of transferring Joule heat to the substrate by thermal conduction, the temperature of the substrate can be raised rapidly. Further, in comparison to a case of heating the substrate with another heat source such as a hotplate, a halogen lamp, etc., power consumption can be reduced. In addition, the LED lamp is long in service life and therefore, a frequency of replacement of components can be decreased in comparison to the case of heating the substrate with another heating lamp such as a halogen lamp, etc.

The substrate includes a silicon wafer and the molybdenum film held by the silicon wafer and the wavelength of the light emitted from the LED lamp is within a range of 300 to 1000 nm.

By this method, the LED lamp is made to emit the light of the wavelength within the range of 300 to 1000 nm. If a temperature of the silicon wafer is not more than 500° C. and the wavelength of the light exceeds the above range, absorptivity of the light by the silicon wafer is low and therefore, the temperature of the substrate cannot be raised rapidly unless the substrate is irradiated with light of high intensity. If the intensity of the light is increased, the power consumption increases and the need to use a larger heating lamp arises. By irradiating the substrate with the light of the wavelength within the above range, the absorptivity of the light can be made high and the substrate can be heated efficiently.

The first heating step includes a step of making a heating lamp emit the light of the first intensity to irradiate the substrate with the light of the first intensity and the substrate processing method further includes a step of making the heating lamp emit the light of the second intensity.

By this method, instead of making a second heating lamp, differing from a first heating lamp emitting the light of the first intensity, emit the light of the second intensity, a single heating lamp is made to emit the light of the first intensity and made to emit the light of the second intensity therebefore or thereafter. That is, the heating lamp is made to emit the light of the first intensity and the light of the second intensity by switching the intensity of the light emitted from the heating lamp. The number of heating lamps can thus be decreased in comparison to a case of providing the first heating lamp and the second heating lamp that differ from each other.

The light of the second intensity that is emitted from the heating lamp may be irradiated on the substrate that has been irradiated or is to be irradiated with the light of the first intensity emitted from the same heating lamp or may be irradiated on the substrate that has been irradiated or is to be irradiated with the light of the first intensity emitted from another heating lamp. In the former case, the second heating step includes a step of making the heating lamp emit the light of the second intensity to irradiate the substrate with the light of the second intensity.

In the substrate processing method, at least one of a single first cycle that includes the first oxidation step and the first etching step and a single second cycle that includes the second oxidation step and the second etching step is performed a plurality of times.

By this method, after heating the substrate while supplying the oxygen gas or the ozone gas to the substrate, the etching liquid is supplied to the substrate. Thereafter, the substrate is heated while supplying the oxygen gas or the ozone gas to the substrate and then the etching liquid is supplied to the substrate again. That is, the oxidation of the molybdenum film and the etching of the molybdenum oxide film are repeated alternately the plurality of times. Thereby, the thickness of the molybdenum film can be decreased in steps and the thickness of the molybdenum film can be adjusted in steps.

If the single first cycle that includes the first oxidation step and the first etching step is performed the plurality of times, a decrease amount of the thickness of the molybdenum film in the first etching step, that is, a thickness of the molybdenum oxide film dissolved in the etching liquid may be the same each time or may differ among the plurality of first etching steps. The same applies when the single second cycle that includes the second oxidation step and the second etching step is performed the plurality of times.

If the first cycle is performed three times or more, the number of times of the second cycle performed between the first cycle and the next first cycle differs in each of a plurality of intervals not more than a total number of intervals between the first cycles.

By this method, the first cycle of heating the substrate at the first temperature by irradiation of the light of the first intensity while supplying the oxygen gas or the ozone gas to the substrate and thereafter supplying the etching liquid to the substrate is performed three times or more. Further, the second cycle of heating the substrate at the second temperature by irradiation of the light of the second intensity while supplying the oxygen gas or the ozone gas to the substrate and thereafter supplying the etching liquid to the substrate is performed once or more.

The number of times of the second cycle performed between two first cycles differs in each of the plurality of intervals not more than the total number of intervals between the first cycles. For example, if the first cycle is performed three times, the second cycle is performed once between the first cycles of the first time and the second time and the second cycle is performed twice between the first cycles of the second time and the third time. If the first cycle is performed four times, the second cycle is performed once between the first cycles of the first time and the second time and the second cycle is performed twice between the first cycles of the second time and the third time. The number of times of the second cycle performed between the first cycles of the third time and the fourth time may be 1 or 2 or may be zero or a value not less than 3.

If, when the first cycle is performed individually on a plurality of substrates, timings at which the first cycle is performed overlap, a usage amount of a processing fluid such as a processing gas, a processing liquid, etc., or a usage amount of electric power increases focally at times. By changing the number of times of the second cycle performed between two first cycles, such focal increase can be made small and the usage amount per time of the processing fluid or electric power can be leveled out.

If the first cycle is performed three times or more, the number of times of the second cycle performed between the first cycle and the next first cycle may differ among the plurality of substrates. Specifically, for processing of a certain substrate, the number of times of the second cycle performed between the first cycle and the next first cycle may differ in each of the plurality of intervals not more than the total number of intervals between the first cycles and for processing of another substrate, the number of times of the second cycle performed between the first cycle and the next first cycle may be the same each time.

The first gas supplying step and the second gas supplying step are steps of supplying the ozone gas to the substrate.

By this method, the substrates are heated while supplying not the oxygen gas but the ozone gas to the substrates. Therefore, in comparison to a case of heating the substrates while supplying the oxygen gas to the substrates, the surface layers of the molybdenum films can be changed to the molybdenum trioxide efficiently. Thereby, a time for changing the surface layers of the molybdenum films to the molybdenum trioxide can be shortened and a throughput (number of substrates processed per unit time) of the substrate processing apparatus can be increased.

The etching liquid is a water-containing liquid having water as a main component.

By this method, the water-containing liquid having water as the main component is supplied to the substrates to etch the substrates. Whereas the molybdenum trioxide dissolves in water, the molybdenum does not dissolve or hardly dissolves in water. The surface layers of the molybdenum films that have changed to the molybdenum trioxide can therefore be removed from the substrates without using a chemical liquid. Thereby, treatment of waste liquid can be simplified and a load on the environment can be lightened in comparison to a case where the etching liquid is a chemical liquid.

The water-containing liquid corresponding to the etching liquid may be water (liquid with which a volume concentration of water is 100% or practically 100%) such as pure water, etc., or may be a liquid with which the volume concentration of water is not less than 90% but less than 100%. In the latter case, a chemical may be dissolved in the water-containing liquid if it is of low concentration. In this case, the surface layers of the molybdenum films that have changed to the molybdenum trioxide can be removed from the substrate in a shorter time.

In the substrate processing method, the first oxidation step, the first etching step, the second oxidation step, and the second etching step are performed inside a single substrate processing apparatus.

By this method, the molybdenum film is oxidized and etched inside the single substrate processing apparatus. In other words, after the substrate has been carried into the substrate processing apparatus through a load port, the substrate is not carried out from the substrate processing apparatus through the load port until the oxidization of the molybdenum film and the etching of the molybdenum oxide film are ended. Therefore, in comparison to a case where the oxidation of the molybdenum film and the etching of the molybdenum oxide film are performed in separate substrate processing apparatuses, time required for transfer of the substrate can be shortened.

Another preferred embodiment of the present invention provides a substrate processing apparatus including a first oxidation unit that includes a first gas supply port supplying an oxygen gas or an ozone gas to a substrate and a first heating lamp irradiating the substrate with light of a first intensity to heat the substrate at a first temperature and heats the substrate at the first temperature by irradiation of the light of the first intensity while supplying the oxygen gas or the ozone gas to the substrate to change a surface layer of a molybdenum film formed on the substrate to molybdenum trioxide without changing a portion other than the surface layer of the molybdenum film to the molybdenum trioxide, a first etching unit that includes a first etching liquid nozzle supplying an etching liquid to the substrate and supplies the etching liquid to the substrate to dissolve, in the etching liquid, the surface layer changed to the molybdenum trioxide by the first oxidation unit while leaving, on the substrate, the portion other than the surface layer of the molybdenum film, a second oxidation unit that is the same as or differs from the first oxidation unit, includes a second gas supply port being the same as or differing from the first gas supply port and supplying the oxygen gas or the ozone gas to the substrate and a second heating lamp being the same as or differing from the first heating lamp and irradiating the substrate with light of a second intensity stronger or weaker than the first intensity to heat the substrate at a second temperature higher or lower than the first temperature, and heats the substrate at the second temperature by irradiation of the light of the second intensity while supplying the oxygen gas or the ozone gas to the substrate to change the surface layer of the molybdenum film to the molybdenum trioxide without changing the portion other than the surface layer of the molybdenum film to the molybdenum trioxide, a second etching unit that is the same as or differs from the first etching unit, includes a second etching liquid nozzle being the same as or differing from the first etching liquid nozzle and supplying the etching liquid to the substrate, and supplies the etching liquid to the substrate to dissolve, in the etching liquid, the surface layer changed to the molybdenum trioxide by the second oxidation unit while leaving, on the substrate, the portion other than the surface layer of the molybdenum film, and a transfer system that transfers the substrate among the first oxidation unit, the first etching unit, the second oxidation unit, and the second etching unit. By this arrangement, the same effects as the substrate processing method described above can be exhibited. At least one of the features related to the substrate processing method described above may be added to the substrate processing apparatus.

The above and other objects, features, and advantages of the present invention will become more apparent from the following detailed description of the preferred embodiments with reference to the attached drawings.

DETAILED DESCRIPTION OF PREFERRED EMBODIMENTS

First, an outline of processing of a substrate W according to a preferred embodiment of the present invention shall be described.

Figure 1A:
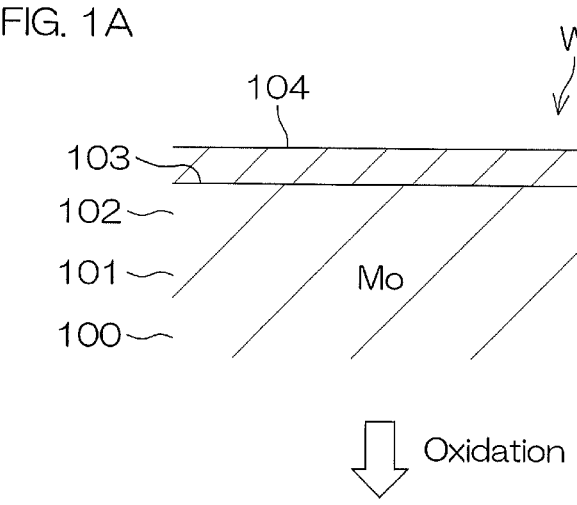
FIG. 1A is a schematic sectional view showing an example of a cross section of a substrate before processing of the substrate according to a preferred embodiment of the present invention is performed.
Figure 1B:
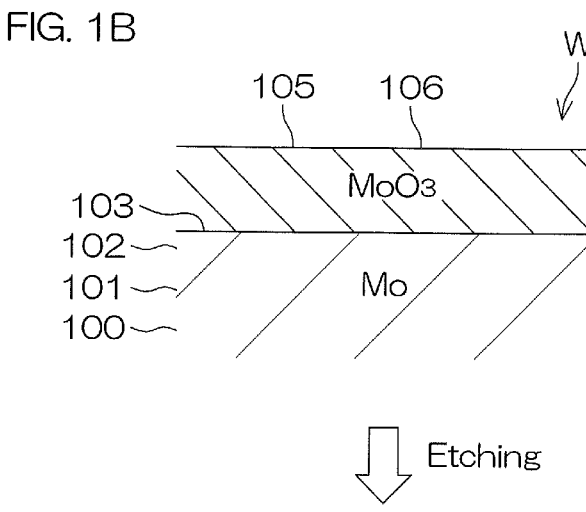
FIG. 1B is a schematic sectional view showing an example of the cross section of the substrate when the processing of the substrate according to the preferred embodiment of the present invention is being performed.
Figure 1C:
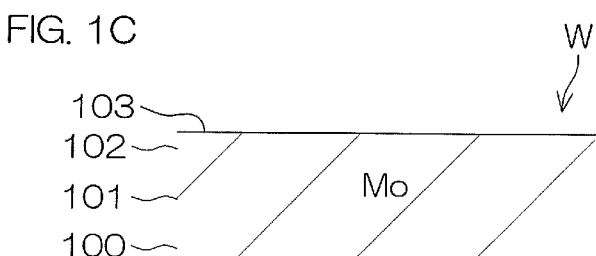
FIG. 1C is a schematic sectional view showing an example of the cross section of the substrate after the processing of the substrate according to the preferred embodiment of the present invention has been performed.

FIG. 1A is a schematic sectional view showing an example of a cross section of the substrate W before processing of the substrate W according to a preferred embodiment of the present invention is performed. FIG. 1B is a schematic sectional view showing an example of the cross section of the substrate W when the processing of the substrate W according to the preferred embodiment of the present invention is being performed. FIG. 1C is a schematic sectional view showing an example of the cross section of the substrate W after the processing of the substrate W according to the preferred embodiment of the present invention has been performed.

A molybdenum film 100 is a thin film made of molybdenum that is formed on a front surface of the substrate W such as a semiconductor wafer, etc. The molybdenum film 100 may be a portion of a metal wiring (molybdenum wiring) that is electrically connected to a transistor or other device formed on the substrate W. The metal wiring may be a metal wiring layer disposed on an interlayer insulating film or may be a metal plug disposed inside a via hole or other hole penetrating through at least one interlayer insulating film or may be both a metal wiring layer and a metal plug.

As shown in FIG. 1A, the molybdenum film 100 is constituted of a surface layer 102 that includes an entire region of a front surface 103 of the molybdenum film 100 and bulk 101 that represents a portion other than the surface layer 102 of the molybdenum film 100. The surface layer 102 of the molybdenum film 100 represents a layer of fixed or substantially fixed thickness from the front surface 103 of the molybdenum film 100. Before the substrate W is processed, the front surface 103 of the molybdenum film 100 may be covered or may be not covered by an oxide of molybdenum. Before the substrate W is processed, the front surface 103 of the molybdenum film 100 or a front surface of the oxide of molybdenum may be covered or may not be covered partially by another substance such as a resist pattern, etc.

FIG. 1A shows an example where the front surface 103 of the molybdenum film 100 is covered by a natural oxide film 104 of molybdenum that contains molybdenum oxide ($MoO_2$) and molybdenum trioxide ($MoO_3$). Molybdenum oxide and molybdenum trioxide are both examples of oxides of molybdenum. With the example shown in FIG. 1A, a portion of or the entire front surface 103 of the molybdenum film 100 is covered by the natural oxide film 104 of molybdenum. The natural oxide film 104 of molybdenum is exposed at the front surface of the substrate W such as a semiconductor wafer, etc., and is in contact with an atmosphere inside a space in which the substrate W is disposed.

In the processing of the substrate W according to a preferred embodiment of the present invention, an oxidation step of heating the substrate W while supplying an ozone gas or other oxygen-atom-containing gas to the substrate W is performed. The ozone gas is an example of an oxygen-atom-containing gas that contains oxygen atoms. The oxygen-atom-containing gas may instead be an oxygen gas. If the natural oxide film 104 or other oxide of molybdenum is formed on the molybdenum film 100, the oxide of molybdenum may be removed from the molybdenum film 100 by wet etching or dry etching before performing the oxidation step or the oxidation step may be performed without removing the oxide of molybdenum.

When performing the oxidation step, the substrate W may be heated by contact heating or non-contact heating or the substrate W may be heated by both contact heating and non-contact heating. If the substrate W is to be heated by contact heating, a lower surface of the substrate W may be put in contact with a hot plate of higher temperature than room temperature (a fixed or substantially fixed temperature within 15 to 30° C.) by disposing the substrate W horizontally on the hot plate in a state where the front surface of the substrate W on which the device is formed is faced upward. If the substrate W is to be heated by non-contact heating, light emitted from a lamp or other heat source may be irradiated on the substrate W. When performing the oxidation step, the substrate W may be in a horizontal or vertical orientation or may be in an orientation other than these.

When the oxidation step is performed, the molybdenum inside the molybdenum film 100 is oxidized by ozone or oxygen molecules inside the atmosphere in contact with the substrate W and the front surface 103 of the molybdenum film 100 changes to molybdenum trioxide. If the front surface 103 of the molybdenum film 100 is covered by the natural oxide film 104 or other oxide of molybdenum, not just the front surface 103 of the molybdenum film 100 but the oxide of molybdenum also changes to the molybdenum trioxide. Thereby, a molybdenum oxide film 105 that contains the molybdenum trioxide is formed on the front surface 103 of the molybdenum film 100 as shown in FIG. 1B.

The molybdenum film 100 changes to the molybdenum trioxide gradually from the front surface 103 of the molybdenum film 100 toward an interior of the molybdenum film 100. A boundary between the molybdenum film 100 and the molybdenum oxide film 105 moves gradually toward the interior of the molybdenum film 100. A thickness of the molybdenum oxide film 105 thereby increases continuously. When a time of performing the oxidation step reaches a maximum growth time to be described later, the molybdenum oxide film 105 of a maximum thickness to be described later is formed on the front surface 103 of the molybdenum film 100.

The molybdenum oxide film 105 is a thin film of the molybdenum trioxide bonded to the molybdenum film 100. The molybdenum oxide film 105 may contain molybdenum oxide or other substance besides the molybdenum trioxide. FIG. 1B shows an example where an entire region of a front surface 106 of the molybdenum oxide film 105 is flat and the thickness of the molybdenum oxide film 105 is uniform. The molybdenum oxide film 105 is thinner than the molybdenum film 100. The thickness of the molybdenum oxide film 105 may instead be not less than the thickness of the molybdenum film 100.

The time of performing the oxidation step (time of heating the substrate W while putting the ozone gas or other oxygen-atom-containing gas in contact with the substrate W) is defined as the oxidation time and conditions of the oxidation step excluding the oxidation time are defined as oxidation conditions, respectively. A plurality of parameters are included in the oxidation conditions. For example, a temperature of the substrate W, a concentration of the ozone gas supplied to the substrate W, and a flow rate of the ozone gas supplied to the substrate W are included in the oxidation conditions. The oxidation time is not included in the oxidation conditions.

The oxidation conditions when the oxygen-atom-containing gas is the ozone gas are as follows. Specifically, the temperature of the substrate W is not less than 150° C. and is, for example, within a range of 180 to 300° C. The concentration of the ozone gas is not less than g/m$^3$ and is, for example, within a range of 100 to 200 g/m$^3$. The flow rate of the ozone gas is not less than 5 SLM (standard liter min) and is, for example, within a range of 18 to 200 SLM. The oxidation time is not less than 30 seconds and is, for example, within a range of 30 to 300 seconds. An etching time to be described later is not less than 30 seconds. A difference between the thickness of the molybdenum film 100 before performing the oxidation step and the thickness of the molybdenum film 100 after performing an etching step is defined as a recess amount. Although depending on the oxidation conditions, the recess amount when the oxidation step and the etching step are performed once each is less than several dozen nm and is, for example, less than 10 nm. The aforementioned numerical values are an example and there are no restrictions thereto.

If the oxidation conditions are fixed, the thickness of the molybdenum oxide film 105 increases as the oxidation time increases. If the oxidation conditions are fixed, even when the oxidation time exceeds the maximum growth time, the thickness of the molybdenum oxide film 105 does not change or hardly changes and stays at or near the maximum thickness. That is, if the oxidation conditions are fixed, although the thickness of the molybdenum oxide film 105 reaches the maximum thickness when the oxidation time reaches the maximum growth time, the thickness of the molybdenum oxide film 105 does not change or hardly changes even if the oxidation step is continued for a longer time. This phenomenon is referred to at times as self-limitation.

The maximum thickness of the molybdenum oxide film 105 depends on the oxidation conditions. The maximum growth time also depends on the oxidation conditions. When an oxidation condition changes, the maximum thickness of the molybdenum oxide film 105 increases or decreases accordingly. For example, when the temperature of the substrate W drops, the maximum thickness of the molybdenum oxide film 105 decreases. The maximum thickness of the molybdenum oxide film 105 also decreases when the concentration or the flow rate of the ozone gas supplied to the substrate W decreases.

After the oxidation step has been performed, the etching step of supplying an etching liquid to the substrate W to remove the molybdenum oxide film 105 from the substrate W is performed as shown in FIG. 1C. FIG. 1C shows an example where the entire molybdenum oxide film 105 is removed by the supplying of the etching liquid and the flat front surface 103 of the molybdenum film 100 formed of molybdenum is exposed. Although it is preferable for the entire molybdenum oxide film 105 to be removed from the substrate W by the supplying of the etching liquid, the molybdenum oxide film 105 may remain on the substrate W if it is of a degree that does not present a problem in a subsequent step.

The etching liquid is a liquid that dissolves the molybdenum trioxide but does not dissolve or hardly dissolves the molybdenum. Whereas the molybdenum trioxide dissolves in water, the molybdenum does not dissolve or hardly dissolves in water. In other words, a rate at which the molybdenum trioxide dissolves in water is greater than a rate at which molybdenum dissolves in water. The etching liquid may therefore be any liquid as long as it is a liquid that contains water. For example, the etching liquid may be water such as pure water (DIW (deionized water)), etc., or may be an aqueous solution such as ammonium hydroxide, alkaline solution, carbonated water, hydrofluoric acid, hydrochloric acid, etc. A proportion of water in the aqueous solution (proportion of water with respect to a solute) may be not less than 100 or may be less than 100.

When the etching liquid contacts the front surface 106 of the molybdenum oxide film 105, the molybdenum trioxide that constitutes the front surface 106 of the molybdenum oxide film 105 dissolves in the etching liquid and the molybdenum oxide film 105 thins gradually. When the etching time, that is, the time for which the etching liquid contacts the molybdenum oxide film 105 reaches an etching end time, all or nearly all of the molybdenum oxide film 105 dissolves in the etching liquid. The etching liquid is a liquid that dissolves the molybdenum trioxide but does not dissolve or hardly dissolves the molybdenum. Therefore, even if the supplying of the etching liquid is continued for not less than the etching end time, the molybdenum film 100 does not thin or hardly thins.

When performing the etching step, the etching liquid may be supplied continuously to the substrate W for not less than the etching end time or the etching liquid may be supplied intermittently to the substrate W such that a cumulative etching time that expresses a total value of the time for which the etching liquid contacts the molybdenum oxide film 105 is not less than the etching end time. Also, when performing the etching step, the orientation of the substrate W may be horizontal or vertical or may be tilted with respect to a horizontal plane. FIG. 1B shows an example where the etching step is performed while the substrate W is maintained horizontal.

If, instead of etching the molybdenum oxide film 105 with the etching liquid after changing the surface layer 102 of the molybdenum film 100 to the molybdenum oxide film 105, an etching liquid that corrodes the molybdenum is supplied to the molybdenum film 100, a roughness (coarseness) of the front surface 103 of the molybdenum film 100 may not be satisfactory. If, as described above, the surface layer 102 of the molybdenum film 100 is changed to the molybdenum oxide film 105 and thereafter removed, the roughness of the molybdenum film 100 after etching can be improved (reduced) in comparison to a case where the molybdenum film 100 is etched directly with an etching liquid.

After all or nearly all of the molybdenum oxide film 105 has been removed from the substrate W, a drying step of drying the substrate W simply or completely is performed. That is, if, when performing the oxidation step for a second time or more as shall be described below, a liquid remaining on the substrate W will not present a problem in the oxidation step, etc., the substrate W may be dried simply such that nearly all of the liquid is removed from the substrate W before performing a subsequent oxidation step. Or, before performing the subsequent oxidation step, the substrate W may be dried completely such that all of the liquid is removed from the substrate W. If a concentration of a chemical contained in the etching liquid is high, the etching liquid may be rinsed off with pure water or other rinse liquid before drying the substrate W.

After the etching step has been performed, the oxidation step is performed for the second time in the same manner as described above and, thereafter, the etching step is performed for a second time. If necessary, the oxidation step and the etching step may be performed for a third time or the oxidation step and the etching step may be performed for a fourth time or more. That is, a single cycle of performing the oxidation step and the etching step in that order may be performed two times or more. Thereby, the thickness of the molybdenum film 100 can be decreased in steps. After a last etching step has been performed, the substrate W is dried completely.

As described above, in the oxidation step, whereas a portion of the molybdenum film 100 at the front surface 103 side changes to the molybdenum trioxide and the thickness of the molybdenum film 100 decreases, the molybdenum film 100 is not etched. If the thickness of the molybdenum oxide film 105 formed in the oxidation step of each time is fixed or substantially fixed, an etching amount will be zero in the oxidation step and the etching amount will be of a fixed or substantially fixed value that exceeds zero in the etching step. Such stepwise etching is also called digital etching.

Next, a substrate processing apparatus 1 shall be described.

Figure 2:
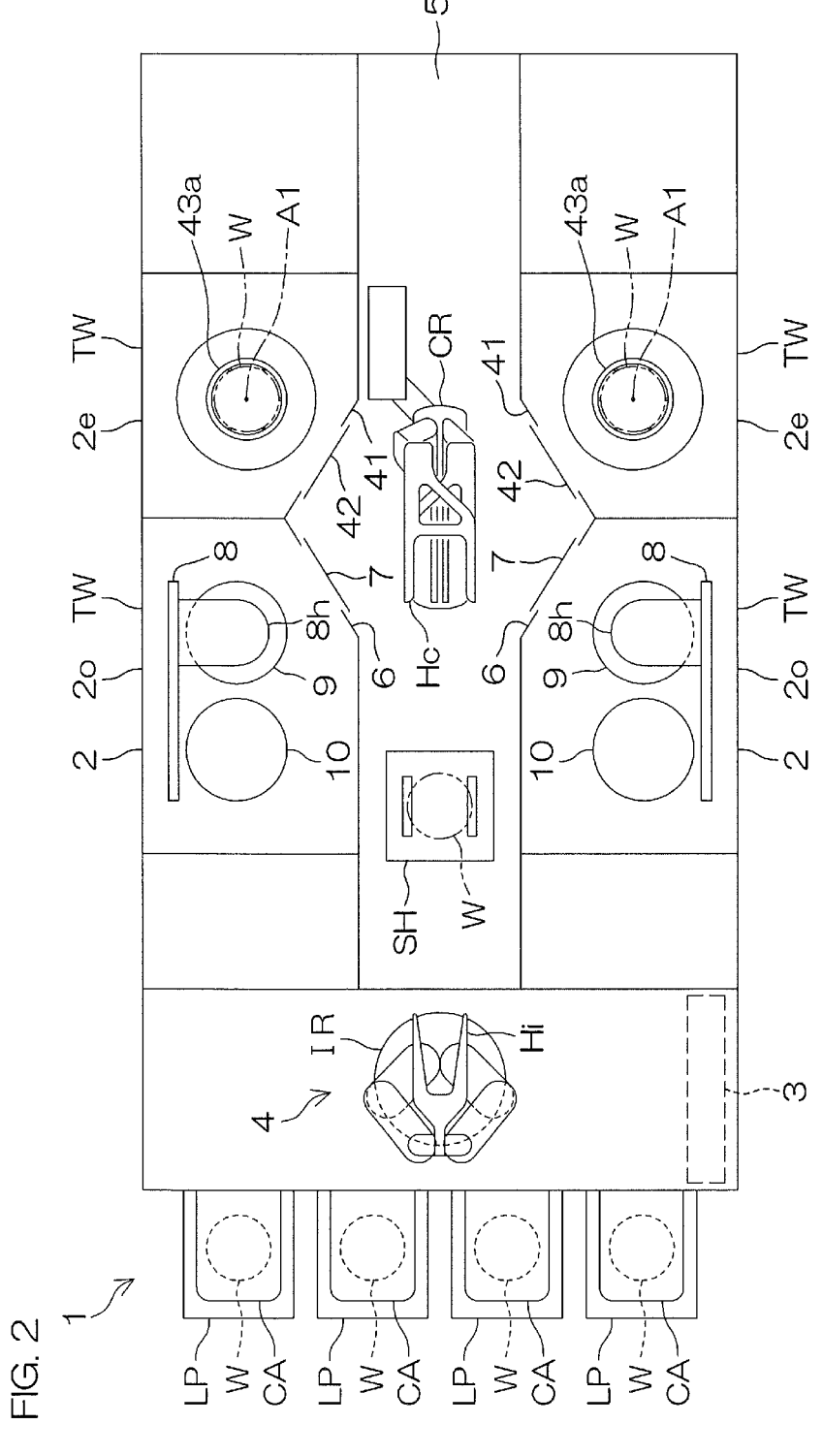
FIG. 2 is a schematic plan view showing a layout of a substrate processing apparatus according to a preferred embodiment of the present invention.

FIG. 2 is a schematic plan view showing a layout of the substrate processing apparatus 1 according to the preferred embodiment of the present invention. The substrate processing apparatus 1 is an apparatus that processes disk-shaped substrates W such as semiconductor wafers. The substrate processing apparatus 1 includes load ports LP that each support a carrier CA housing a plurality of the substrates W, a plurality of processing units 2 that process the substrates W transferred from the carriers CA on the load ports LP with processing fluids such as a processing liquid, processing gas, etc., a transfer system 4 that transfers the substrates W between the carriers CA on the load ports LP and the plurality of processing units 2, and a controller 3 that controls the substrate processing apparatus 1.

The plurality of processing units 2 form a plurality of towers TW that each include one or more processing units 2. FIG. 2 shows an example where four towers TW are formed. When a plurality of processing units 2 are included in a single tower TW, the plurality of processing units 2 are stacked vertically. The number of processing units 2 included in a single tower TW may be the same for all towers TW or may differ among all towers TW or a plurality thereof less than the total number.

The plurality of towers TW form two columns aligned in a depth direction (right/left direction of FIG. 2; in plan view, a direction orthogonal to an alignment direction of the plurality of load ports LP) of the substrate processing apparatus 1 in plan view. The two columns face each other across a rectilinear transfer passage 5 that extends in the depth direction of the substrate processing apparatus 1 in plan view. A center robot CR to be described later is disposed in the transfer passage 5.

The plurality of processing units 2 include one or more oxidation processing units 2o that perform the oxidation step and one or more etching processing units 2e that perform the etching step and the drying step. Each oxidation processing unit 2o is a single substrate processing type unit that oxidizes a plurality of substrates W one at a time. Each etching processing unit 2e is a single substrate processing type unit that etches and dries a plurality of substrates W one at a time.

FIG. 2 shows an example where, in each of the two columns, a single tower TW closest to the load ports LP is constituted of the oxidation processing units 2o and the remaining single tower TW is constituted of the etching processing units 2e. In this example, all processing units 2 included in a single tower TW are processing units 2 of the same type (oxidation processing units 2o or etching processing units 2e). The number and placement of the towers TW constituted by the oxidation processing units 2o are not restricted to the example shown in FIG. 2. A single tower TW may include both oxidation processing units 2o and etching processing units 2e.

Each oxidation processing unit 2o includes a chamber 6 that forms an oxidation space SO (see FIG. 3), a shutter 7 that opens and closes an entrance/exit provided on the chamber 6, an oxidation unit 10 that supplies a processing gas to the substrate W while heating the substrate W inside the chamber 6, a cooling unit 9 that cools the substrate W, heated by the oxidation unit 10, inside the chamber 6, and a local transfer robot 8 that transfers the substrate W inside the chamber 6.

The local transfer robot 8 includes one or more hands 8h that support the substrate W horizontally. Each hand 8h is movable in parallel in both a horizontal direction and a vertical direction. The local transfer robot 8 receives the substrate W from the center robot CR inside the chamber 6 and transfers the substrate W to the center robot CR inside the chamber 6. The local transfer robot 8 further transfers the substrate W to each of the oxidation unit 10 and the cooling unit 9 and receives the substrate W from each of the oxidation unit 10 and the cooling unit 9.

Each etching processing unit 2e includes a chamber 41 that forms an etching space SE (see FIG. 4), a shutter 42 that opens and closes an entrance/exit provided on the chamber 41, a spin chuck 43a that rotates a single substrate W around a vertical rotational axis A1 passing through a central portion of the substrate W while holding it horizontally inside the etching space SE, and a plurality of nozzles that discharge a processing liquid toward the substrate W held by the spin chuck 43a.

The transfer system 4 includes a shuttle robot SH on which the substrates W that are transferred between the carriers CA on the load ports LP and the plurality of processing units 2 are placed temporarily, an indexer robot IR that transfers the substrates W between the carriers CA on the load ports LP and the shuttle robot SH, and the center robot CR that transfers the substrates W between the shuttle robot SH and the plurality of processing units 2.

The shuttle robot SH is disposed between the indexer robot IR and the center robot CR in plan view. By the shuttle robot SH, one or more substrates W are transferred between the indexer robot IR and the center robot CR while being held horizontally. The indexer robot IR and the center robot CR perform carry-in and carry-out of the substrates W to and from the shuttle robot SH. The substrates W are transferred between the indexer robot IR and the center robot CR via the shuttle robot SH. The substrates W may instead be transferred directly between the indexer robot IR and the center robot CR without intervention by the shuttle robot SH.

The indexer robot IR is disposed between the shuttle robot SH and the load ports LP in plan view. The indexer robot IR includes one or more hands Hi that support the substrates W horizontally. Each hand Hi is movable in parallel in both the horizontal direction and the vertical direction. The hand Hi is rotatable by not less than 180 degrees around a vertical straight line. The hand Hi can perform carry-in and carry-out of the substrates W with respect to the carrier CA of any load port LP and can perform carry-in and carry-out of the substrates W with respect to the shuttle robot SH.

The center robot CR is disposed inside the transfer passage 5 that extends in the depth direction of the substrate W from the shuttle robot SH in plan view. The center robot CR includes one or more hands Hc that support the substrates W horizontally. Each hand Hc is movable in parallel in both the horizontal direction and the vertical direction. The hand Hc is rotatable by not less than 180 degrees around a vertical straight line. The hand Hc can perform carry-in and carry-out of the substrates W with respect to the shuttle robot SH and can perform carry-in and carry-out of the substrates W with respect to any of the processing units 2.

Planar and three-dimensional placements of the plurality of processing units 2 are not restricted to those of the example shown in FIG. 2. That is, as long as the center robot CR is capable of performing carry-in and carry-out of the substrates W with respect to any of the processing units 2, the plurality of processing units 2 may be placed in any manner. The number of center robots CR provided in the substrate processing apparatus 1 may be two or more. In this case, as long as at least one center robot CR is capable of performing carry-in and carry-out of the substrates W with respect to the respective processing units 2, a single center robot CR does not have to be able to perform carry-in and carry-out of the substrates W with respect to all of the processing units 2.

Carriers CA each housing a plurality of substrates W with each of which the molybdenum film 100 or the natural oxide film 104 of molybdenum is exposed as shown in FIG. 1A are placed on the load ports LP by a carrier transfer robot installed in a manufacturing plant in which semiconductor devices, FPDs, etc., are manufactured. Each carrier CA is a container that holds and houses a plurality of substrates W in horizontal orientations such that the plurality of substrates W face each other in parallel at intervals. The carrier CA may be a FOUP (front-opening unified pod) or a container other than a FOUP.

An unprocessed substrate W is carried out from a carrier CA on a load port LP by the indexer robot IR and carried into an oxidation processing unit 2o by the center robot CR. The oxidation unit 10 of the oxidation processing unit 2o performs the oxidation step on the substrate W that has been carried in. The substrate W on which the oxidation step has been performed is carried out from the oxidation processing unit 2o by the center robot CR and carried into an etching processing unit 2e by the center robot CR. Before the substrate W on which the oxidation step has been performed is carried out from the oxidation processing unit 2o, the substrate W may be cooled as necessary by the cooling unit 9 of the oxidation processing unit 2o.

The etching processing unit 2e performs the etching step and the drying step on the substrate W that has been carried in. Thereafter, the substrate W is carried out from the etching processing unit 2e and carried into an oxidation processing unit 2o that is the same as or different from that of the previous time by the center robot CR. The substrate W on which the oxidation step of the second time has been performed is carried out from the oxidation processing unit 2o and carried into an etching processing unit 2e that is the same as or different from that of the previous time by the center robot CR.

A single cycle that includes the oxidation step, the etching step, and the drying step is thus performed a plurality of times on a single substrate W. The substrate W on which all processing has been performed is carried into a carrier CA on the same or a different load port LP by the indexer robot IR. Thereafter, a carrier CA housing a plurality of processed substrates W is transferred from a load port LP to a next destination by the carrier transfer robot.

Next, the oxidation processing unit 2o shall be described in detail.

Figure 3:
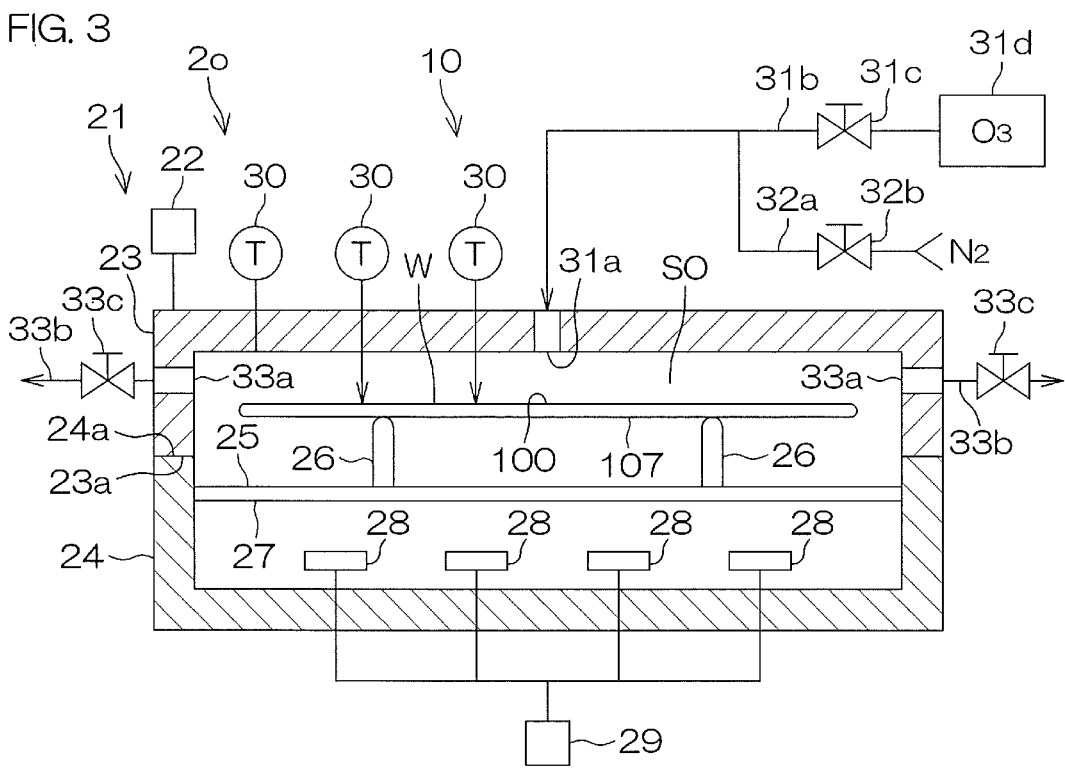
FIG. 3 is schematic sectional view showing an example of a vertical section of an oxidation unit provided in an oxidation processing unit.

FIG. 3 is schematic sectional view showing an example of a vertical section of the oxidation unit 10 provided in the oxidation processing unit 2o. The oxidation unit 10 includes a chamber 21 that houses the substrate W. The chamber 21 includes a fixed container 24 that is disposed below the substrate W and a movable lid 23 that is disposed above the substrate W. The movable lid 23 is movable up and down between an open position at which entry and exit of the substrate W in and out of a space between the movable lid 23 and the fixed container 24 are enabled and a closed position (position shown in FIG. 3) at which the space between the movable lid 23 and the fixed container 24 is sealed.

An opening/closing actuator 22 moves the movable lid 23 up and down between the open position and the closed position. When the opening/closing actuator 22 moves the movable lid 23 to the closed position, an annular portion 23a of the movable lid 23 overlaps across its entire circumference with an annular portion 24a of the fixed container 24 via a seal at an outer side of the oxidation space SO and a gap between the annular portion 23a and the annular portion 24a is sealed. The sealed oxidation space SO is thereby formed between the movable lid 23 and the fixed container 24.

The opening/closing actuator 22 is an actuator that moves the movable lid 23. The actuator is a device that converts electrical, fluid, magnetic, heat, or chemical energy to mechanical work. The actuator includes an electric motor, air cylinder, and other devices. The opening/closing actuator 22 may be an electric motor or an air cylinder or may be other than these. The definition of an actuator is the same for other actuators.

The oxidation unit 10 includes a susceptor 25 that holds the substrate W horizontally inside the chamber 21. The susceptor 25 includes a plurality of support pins 26 that support the substrate W by contacting a lower surface of the substrate W and a partition 27 that supports the plurality of support pins 26. The support pins 26 and the partition 27 are disposed between the movable lid 23 and the fixed container 24 in an up/down direction. The partition 27 may be a single plate or may be a plurality of plates that are disposed on a single plane and are mutually coupled.

The plurality of support pins 26 project upward from an upper surface of the partition 27. The hand 8h (see FIG. 2) of the local transfer robot 8 places the substrate W on the plurality of support pins 26 and takes the substrate W on the plurality of support pins 26. When the substrate W is placed on the plurality of support pins 26, the lower surface of the substrate W and the upper surface of the partition 27 face each other in a state where the lower surface of the substrate W is separated upward from the upper surface of the partition 27.

The support pins 26 may be integral to the partition 27 or fixed to the partition 27 or may be movable up and down with respect to the partition 27. In the former case, a height of the support pins 26, that is, a distance in the up/down direction from the upper surface of the partition 27 to upper ends of the support pins 26 should be set such that the hand 8h can be disposed between a support position at which the substrate W supported by the plurality of support pins 26 is disposed and the upper surface of the partition 27. In the latter case, the plurality of support pins 26 may be moved up and down between upper positions at which the hand 8h places the substrate W on the plurality of support pins 26 and takes the substrate W on the plurality of support pins 26 and lower positions that are lower than the upper positions. The height of the support pins 26 when the plurality of support pins 26 are disposed at the lower positions may be less than the height of the former case.

The partition 27 is disposed inside the fixed container 24. The partition 27 partitions an internal space of the chamber 21 into an upper space at an upper side of the partition 27 and a lower space at a lower side of the partition 27. The upper space is a space from the upper surface of the partition 27 to a ceiling surface of the movable lid 23. The lower space is a space from a bottom surface of the fixed container 24 to a lower surface of the partition 27. The upper space corresponds to the oxidation space SO. When the movable lid 23 is disposed at the closed position, the upper space corresponding to the oxidation space SO is sealed. A gap between an inner circumferential surface of the fixed container 24 and an outer circumferential surface of the partition 27 is sealed and a fluid inside the upper space cannot move to the lower space. The lower space may be a sealed space or an open space that allows a fluid to enter and exit freely.

The oxidation unit 10 includes at least one heating lamp 28 that irradiates light onto the substrate W supported by the susceptor 25 inside the oxidation space SO to heat the substrate W at a heating temperature. Each heating lamp 28 is an example of a heater that heats the substrate W inside the oxidation space SO. The heating lamp 28 includes a light source that emits light upon being supplied with electric power and a transparent case that houses the light source. The heating lamp 28 may be a halogen lamp or an LED (light emitting diode) lamp or a lamp other than these.

FIG. 3 shows an example where four heating lamps 28 are disposed inside the chamber 21 and each of the heating lamps 28 is an LED lamp. In this example, the four heating lamps 28 are disposed below the substrate W. The number of heating lamps 28 that irradiate light toward the substrate W inside a single chamber 21 may be less than four or not less than five. As long as light can be irradiated on the substrate W inside the chamber 21, the heating lamps 28 may be disposed outside the chamber 21. All or a portion of the heating lamps 28 may be disposed above the substrate W.

In the example shown in FIG. 3, the four heating lamps 28 are disposed below the partition 27. The light of the heating lamps 28 is transmitted through the partition 27 and irradiates the substrate W on the plurality of support pins 26. At least a portion of the partition 27 is made of material that transmits the light of the heating lamps 28. For example, an entirety of the susceptor 25 may be made of quartz. As long as the substrate W on the plurality of support pins 26 can be heated uniformly by the light of all of the heating lamps 28, an entirety of the partition 27 does not have to be made of a material that transmits the light of the heating lamps 28.

The substrate W that is irradiated with the light of the LED lamps includes a silicon wafer 107 of disk shape that is an example of a semiconductor wafer and the molybdenum film 100 that is held by the silicon wafer 107. The LED lamps emit light of a wavelength within a range of 300 to 1000 nm. That is, light of the wavelength within the above range is included in the light emitted from the LED lamps. The wavelength of light of the highest intensity among the light emitted from the LED lamps may be within the above range or may be outside the above range. All of the wavelengths of the light emitted from the LED lamps may be within the above range or just a portion of the wavelengths of the light emitted from the LED lamps may be within the above range. All of the wavelengths of the light emitted from the LED lamps may be outside the above range.

The oxidation unit 10 includes an intensity control circuit 29 that controls the intensity of the light emitted from the heating lamps 28 by controlling an electric current supplied to the heating lamps 28. The intensity control circuit 29 is an electric circuit that increases or decreases the electric current supplied to the heating lamps 28 to increase or decrease the intensity of the light emitted from the heating lamps 28 and stabilizes the electric current supplied to the heating lamps 28 to stabilize the intensity of the light emitted from the heating lamps 28.

The intensity control circuit 29 makes the heating lamps 28 emit light of any intensity within a range from a minimum intensity to a maximum intensity. When the intensity of the light emitted from the heating lamps 28 changes, the irradiance of the light irradiated on the substrate W changes and the temperature of the substrate W changes as well. The intensity control circuit 29 can thus maintain the substrate W at any temperature within a range from a minimum temperature corresponding to the minimum intensity to a maximum temperature corresponding to the maximum intensity. The minimum temperature is 150° C. and the maximum temperature is 300° C. These numerical values are an example and there is no restriction thereto. For example, the maximum temperature may be 500° C. instead.

The oxidation unit 10 may include a radiation thermometer 30 that non-contactingly measures the temperature of the substrate W supported by the susceptor FIG. 3 shows an example where three radiation thermometers 30 are held by the movable lid 23 and disposed above the substrate W. During irradiation of the substrate W with the light of the heating lamps 28, a feedback control of making the intensity control circuit 29 change the intensity of the light based on detection values of the radiation thermometers 30 may be performed. By doing so, overshoot and undershoot of the actual temperature of the substrate W can be made small.

The oxidation unit 10 includes a gas supply port 31a that supplies the ozone gas to the substrate W inside the oxidation space SO. The gas supply port 31a includes a space through which the ozone gas passes and an end surface that forms the space (typically, an end surface of annular shape that surrounds an entire circumference of the space). As long as the ozone gas that flows out from the gas supply port 31a is supplied to the oxidation space SO, the gas supply port 31a may be opened at a wall surface that forms the oxidation space SO or may be disposed further inward than the wall surface. FIG. 3 shows an example of the former.

In addition to the gas supply port 31a, the oxidation unit 10 includes an ozone gas generator 31d that generates the ozone gas to be supplied to the gas supply port 31a, an ozone gas piping 31*b* that guides ozone gas generated by the ozone gas generator 31*d* toward the gas supply port 31*a*, and an ozone gas valve 31*c* that opens and closes between an open state in which the ozone gas flows from the ozone gas piping 31*b* to the gas supply port 31*a* and a closed state in which the ozone gas does not flow from the ozone gas piping 31*b* to the gas supply port 31*a*.

Although not illustrated, the ozone gas valve 31*c* includes a valve body that is provided with an internal flow passage through which a fluid flows and a valve seat with an annular shape forming a portion of the internal flow passage, a valve element that is movable with respect to the valve seat, and an actuator that moves valve element between a closed position at which the valve element contacts the valve seat and an open position at which the valve element is separated from the valve seat. The same also applies to other valves. The actuator may be a pneumatic actuator or an electric actuator or may be an actuator other than these. The controller 3 (see FIG. 2) controls the actuator to open and close the ozone gas valve 31*c*.

The oxidation unit 10 further includes an exhaust port 33*a* that exhausts a gas inside the oxidation space SO, an exhaust piping 33*b* that guides the gas, which flowed into the exhaust port 33*a*, in a direction away from the oxidation space SO, and an exhaust valve 33*c* that opens and closes between an open state in which the gas inside the oxidation space SO flows into the exhaust port 33*a* and a closed state in which the gas inside the oxidation space SO does not flow into the exhaust port 33*a*. The exhaust port 33*a* includes a space through which the gas to be exhausted passes and an end surface that forms this space. As long as the exhaust port 33*a* can exhaust the gas inside the oxidation space SO, the exhaust port 33*a* may be opened at a wall surface that forms the oxidation space SO or may be disposed further inward than the wall surface.

When the ozone gas valve 31*c* is opened, the ozone gas flows out from the gas supply port 31*a* and is supplied to the oxidation space SO. When the supplying of the ozone gas is continued in the state where the exhaust valve 33*c* is open, the oxidation space SO becomes filled with the ozone gas. The filling of the oxidation space SO with the ozone gas may be performed by supplying the ozone gas to the oxidation space SO while exhausting the gas inside the oxidation space SO to the exhaust port 33*a* or may be performed by supplying the ozone gas to the oxidation space SO after exhausting the gas inside the oxidation space SO to the exhaust port 33*a*.

After the oxidation space SO is filled with the ozone gas, the supplying of the ozone gas from the gas supply port 31*a* and the exhausting of the gas to the exhaust port 33*a* may be continued or may be stopped. In the former case, a gas pressure inside the oxidation space SO may be maintained at a value not less than or less than a gas pressure outside the oxidation space SO while filling the oxidation space SO with the ozone gas. In this case, the exhaust valve 33*c* may be a relief valve that, when the gas pressure of the oxidation space SO rises to not less than a set value, makes the gas inside the oxidation space SO flow into the exhaust port 33*a* until the gas pressure drops to less than the set value. The exhaust valve 33*c* may include both an opening/closing valve and the relief valve.

The oxidation unit 10 includes an inert gas piping 32*a* guiding a nitrogen gas that is an example of an inert gas to be supplied to the oxidation space SO and an inert gas valve 32*b* opening and closing between an open state in which the nitrogen gas flows to the oxidation space SO from the inert gas piping 32*a* and a closed state in which the nitrogen gas does not flow to the oxidation space SO from the inert gas piping 32*a*. FIG. 3 shows an example where the nitrogen gas inside the inert gas piping 32*a* is supplied to the oxidation space SO via the gas supply port 31*a*. The nitrogen gas inside the inert gas piping 32*a* may instead be supplied to the oxidation space SO via a gas supply port that is separate from the gas supply port 31*a*.

After the ozone gas is supplied to the oxidation space SO, the ozone gas inside the oxidation space SO is exhausted through the exhaust port 33*a*. Specifically, after the ozone gas is supplied to the oxidation space SO, the ozone gas valve 31*c* is closed and the inert gas valve 32*b* is opened in a state where the exhaust valve 33*c* is open. Thereby, the nitrogen gas is supplied to the oxidation space SO and the gas inside the oxidation space SO such as the ozone gas, etc., is exhausted to the exhaust port 33*a*. Consequently, the ozone gas inside the oxidation space SO is replaced by the nitrogen gas and the oxidation space SO is filled with the nitrogen gas.

An example of processing of the substrate W performed by the oxidation unit 10 is as follows.

Specifically, when the substrate W is to be processed by the oxidation unit 10, the local transfer robot 8 moves the hand 8*h* above the fixed container 24 while holding the substrate W horizontally with the hand 8*h* in a state where the movable lid 23 is disposed at the open position. Thereafter, local transfer robot 8 places, on the susceptor 25, the substrate W on the hand 8*h* and moves the hand 8*h* out of the chamber 21. Thereafter, the opening/closing actuator 22 moves the movable lid 23 to the closed position and seals the interval between the movable lid 23 and the fixed container 24.

After the movable lid 23 has been disposed at the closed position, the ozone gas is made to fill the oxidation space SO and is supplied to the substrate W inside the oxidation space SO as described above. The heating lamps 28 are made to start emitting light before filling or after filling the oxidation space SO with the ozone gas. Thereby, the light of the intensity corresponding to a set temperature is emitted from the heating lamps 28 and the substrate W is heated at the set temperature by the irradiation of the light. Thereafter, the oxidation step is performed continuously for not less than the above-described maximum growth time while maintaining fixed the conditions such as the temperature of the substrate W, the concentration of the ozone gas in the atmosphere in contact with the substrate W, etc.

When the oxidation step is performed, oxygen atoms in the atmosphere in contact with the substrate W bond with the molybdenum inside the molybdenum film 100 (see FIG. 1B) and the molybdenum changes to molybdenum trioxide. The oxygen atoms diffuse inside the molybdenum film 100. The molybdenum oxide film 105 (see FIG. 1B) that contains the molybdenum trioxide is thereby formed on the front surface 103 of the molybdenum film 100. Further, if the oxidation step is performed continuously for not less than the maximum growth time while maintaining the oxidation conditions fixed, the thickness of the molybdenum oxide film 105 increases to the maximum thickness and stays at the maximum thickness due to the self-limitation described above.

After the oxidation step has been performed, the heating lamps 28 are made to stop emitting light. Before or after the heating lamps 28 stop emitting light, the gas inside the oxidation space SO such as the ozone gas, etc., is exhausted through the exhaust port 33*a* and the oxidation space SO is filled with a gas other than the ozone gas such as the inert gas, etc. After the heating lamps 28 have stopped emitting light and the ozone gas inside the oxidation space SO has been exhausted, the local transfer robot 8 moves the hand 8*h* to above the fixed container 24 in a state where the movable lid 23 is disposed at the open position. Thereafter, the local transfer robot 8 takes the substrate W on the susceptor 25 with the hand 8*h* and moves the hand 8*h* out of the chamber 21.

The ozone gas is thus supplied to the sealed oxidation space SO. The heating lamps 28 are partitioned off from the oxidation space SO by the partition 27. The gas inside the oxidation space SO cannot move to the lower space in which the heating lamps 28 are disposed. Exposure of the heating lamps 28 to the ozone gas can thus be prevented. Further, since the substrate W is supported by point contact or line contact of the substrate W and the support pins 26, a contact area of the substrate W and the susceptor 25 can be made small and a heat amount diffusing from the substrate W to the susceptor 25 can be reduced. The substrate W can thereby be heated efficiently by the light of the heating lamps 28.

If the substrate W is heated by the light of the LED lamps that are an example of the heating lamps 28, thermal energy can be concentrated on the substrate W in comparison to a case of heating the substrate W with a hotplate and activity of the oxygen atoms in the substrate W and a vicinity thereof can be increased efficiently. Further, when the LED lamps are made to start emitting light, the temperature of the substrate W rises rapidly and when the LED lamps are made to stop emitting light, the temperature of the substrate W falls rapidly. Since the temperature of the substrate W falls rapidly when the LED lamps are made to stop emitting light, cooling of the substrate W can be omitted or a time for cooling the substrate W can be shortened.

On the other hand, if the substrate W is to be heated by a hotplate, preheating of the hotplate is necessary and additionally, in order to stabilize the temperature of the hotplate, the temperature of the hotplate cannot be lowered even after the maximum growth time has elapsed. Power consumption can thus be decreased significantly than in the case of heating the substrate W with the hotplate. Further, in comparison to the case of heating the substrate W with the hotplate, a heat amount transmitted to a member other than the substrate W can be decreased and corrosion of the member due to heating can be prevented or delayed.

Figure 4:
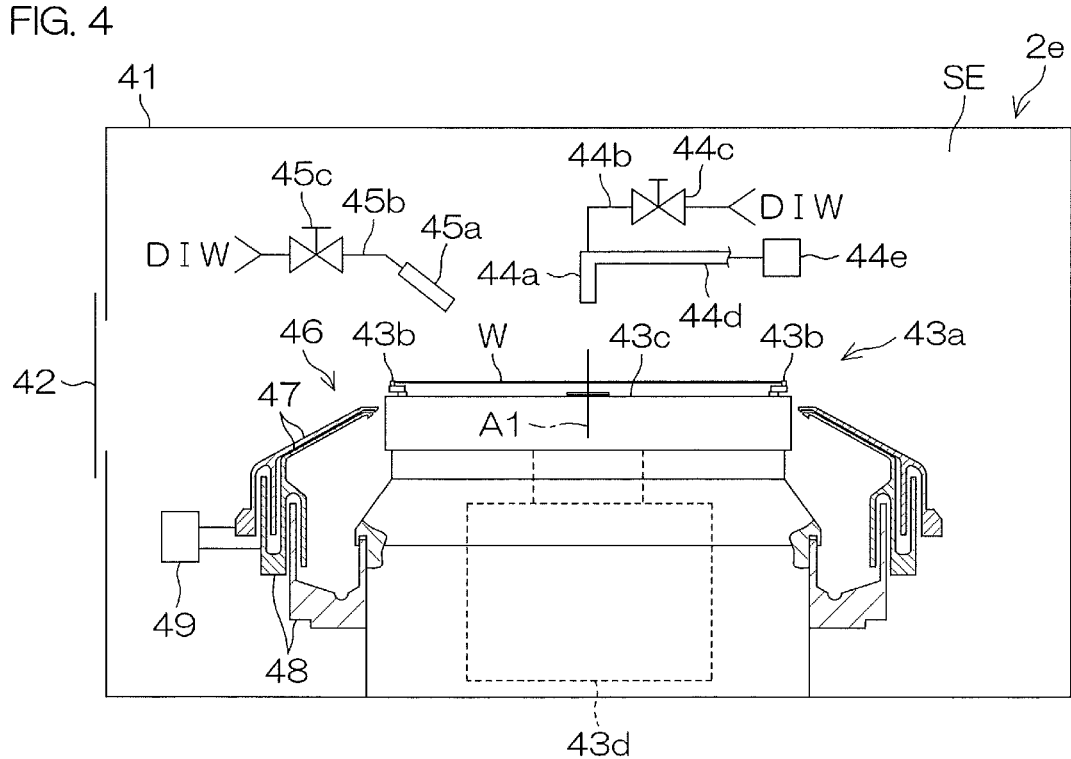
FIG. 4 is a schematic sectional view showing an example of a vertical section of an etching processing unit.

Next, the etching processing unit 2*e* shall be described. FIG. 4 is a schematic sectional view showing an example of a vertical section of the etching processing unit 2*e*. The etching processing unit 2*e* includes the chamber 41 that forms the etching space SE, the shutter 42 that opens and closes the entrance/exit provided on the chamber 41, and the spin chuck 43*a* that rotates the single substrate W around the vertical rotational axis A1 passing through the central portion of the substrate W while holding it horizontally inside the etching space SE.

The spin chuck 43*a* may be a chuck of a clamping type with which a plurality of chuck pins 43*b* are put in contact with an outer circumferential surface of the substrate W or may be a chuck of a vacuum type with which a rear surface (lower surface) that is a non-device-forming surface of the substrate W is suctioned onto an upper surface of a spin base 43*c* to hold the substrate W horizontally. FIG. 4 shows an example of the former. The spin chuck 43*a* includes an electric motor 43*d* that rotates the substrate W, held in a horizontal orientation by the spin chuck 43*a*, around the rotational axis A1.

The etching processing unit 2*e* includes an etching liquid nozzle 44*a* that supplies the etching liquid to an upper surface of the substrate W held by the spin chuck 43*a* and a rinse liquid nozzle 45*a* that supplies the rinse liquid to the upper surface of the substrate W held by the spin chuck 43*a*. FIG. 4 shows an example where the etching liquid and the rinse liquid are both pure water (indicated as DIW in FIG. 4). The rinse liquid is not restricted to pure water and may be any of IPA (isopropyl alcohol), carbonated water, electrolyzed ion water, hydrogen water, ozone water, an aqueous hydrochloric acid solution of dilute concentration (for example, approximately 10 to 100 ppm), and an ammonium hydroxide of dilute concentration (for example, approximately 10 to 100 ppm). The rinse liquid may be a liquid of different type from the etching liquid.

As shown in FIG. 4, the etching processing unit 2*e* includes an etching liquid piping 44*b* that guides the etching liquid toward the etching liquid nozzle 44*a* and an etching liquid valve 44*c* that opens and closes between an open state in which the etching liquid flows from the etching liquid piping 44*b* to the etching liquid nozzle 44*a* and a closed state in which the etching liquid does not flow from the etching liquid piping 44*b* to the etching liquid nozzle 44*a*. When the etching liquid valve 44*c* is opened, the etching liquid is discharged continuously downward from a discharge port of the etching liquid nozzle 44*a*.

The etching processing unit 2*e* includes a rinse liquid piping 45*b* that guides the rinse liquid toward the rinse liquid nozzle 45*a* and a rinse liquid valve 45*c* that opens and closes between an open state in which the rinse liquid flows from the rinse liquid piping 45*b* to the rinse liquid nozzle 45*a* and a closed state in which the rinse liquid does not flow from the rinse liquid piping 45*b* to the rinse liquid nozzle 45*a*. When the rinse liquid valve is opened, the rinse liquid is discharged continuously downward from a discharge port of the rinse liquid nozzle 45*a*.

The etching liquid nozzle 44*a* may be scan nozzle by which a collision position of the processing liquid with respect to the substrate W can be moved within the upper surface or the lower surface of the substrate W or may be a fixed nozzle by which the collision position of the processing liquid with respect to the substrate W cannot be moved. The same applies to the rinse liquid nozzle 45*a*. FIG. 4 shows an example where the etching liquid nozzle 44*a* is a scan nozzle and the rinse liquid nozzle 45*a* is a fixed nozzle.

The etching liquid nozzle 44*a* is connected to a nozzle actuator 44*e* that moves the etching liquid nozzle 44*a* in at least one of the vertical direction and the horizontal direction. The etching liquid nozzle 44*a* extends downward from a tip of a nozzle arm 44*d* that extends horizontally. The nozzle actuator 44*e* is connected to the etching liquid nozzle 44*a* via the nozzle arm 44*d*. The nozzle actuator 44*e* moves the nozzle arm 44*d* to move the etching liquid nozzle 44*a* horizontally between a processing position at which the etching liquid discharged from the etching liquid nozzle 44*a* is supplied to the upper surface of the substrate W (position shown in FIG. 4) and a standby position at which the etching liquid nozzle 44*a* is positioned in a periphery of the spin chuck 43*a*.

The etching processing unit 2*e* includes a processing cup 46 of cylindrical shape that receives liquid splashed from the spin chuck 43*a* or the substrate W held by the spin chuck 43*a*. The processing cup 46 includes a plurality of guards 47 that receives liquid splashed outward from the substrate W or the spin chuck 43*a* and a plurality of cups 48 that receive liquid guided downward by the plurality of guards 47. FIG. 2 shows an example where two guards 47 and two cups 48 are provided and a single cup 48 and a single guard 47 are integral.

The etching processing unit 2e includes a guard elevating/lowering unit 49 that elevates and lowers the plurality of guards 47 individually. The guard elevating/lowering unit 49 positions each guard 47 at any position from an upper position to a lower position. The upper position is a position at which an upper end of the guard 47 is disposed higher than a holding position at which the substrate W held by the spin chuck 43a is disposed. The lower position is a position at which the upper end of the guard 47 is disposed lower than the holding position. The upper end of the guard 47 surrounds the substrate W and the spin base 43c in plan view.

When the processing liquid is supplied to the substrate W in a state where the spin chuck 43a is rotating the substrate W, the processing liquid supplied to the substrate W is spun off from the substrate W. When the processing liquid is supplied to the substrate W, the upper end of at least one guard 47 is disposed higher than the substrate W. Therefore, the processing liquid, such as a chemical liquid, the rinse liquid, etc., that is expelled from the substrate W is received by either guard 47 and is guided to the cup 48 corresponding to the guard 47.

An example of processing of the substrate W performed at the etching processing unit 2e is as follows.

Specifically, the center robot CR (see FIG. 2) moves the hand Hc to above the spin chuck 43a while supporting the substrate W horizontally with the hand Hc in a state where the entrance/exit of the etching processing unit 2e is open. After placing the substrate W on the spin chuck 43a, the center robot CR moves the hand Hc out of the etching processing unit 2e through the entrance/exit. Thereafter, the entrance/exit is closed by the shutter 42. When the substrate W is placed on the spin chuck 43a, the spin chuck 43a holds the substrate W by the plurality of chuck pins 43b and rotates the substrate W by the electric motor 43d. The guard elevating/lowering unit 49 elevates at least one guard 47 from the lower position to the upper position.

After the substrate W has been held by the spin chuck 43a, the etching step of supplying the etching liquid to the substrate W is performed. Specifically, in a state where the spin chuck 43a is rotating the substrate W, the etching liquid valve 44c is opened and the etching liquid nozzle 44a is made to start discharge of the etching liquid. The etching liquid is thereby supplied to an entire area of the upper surface of the substrate W. After the entire area of the upper surface of the substrate W has been covered by a liquid film of the etching liquid, a puddle step in which supplying anew of the etching liquid to the substrate W is stopped and a state in which the entire area of the upper surface of the substrate W is covered by the liquid film of the etching liquid is maintained while the substrate W is made stationary or rotated at a low speed (for example, of not more than 30 rpm) may be performed.

When the etching liquid has been supplied to the substrate W for not less than the etching end time described above, the etching liquid valve 44c is closed. Thereafter, a rinsing step of supplying the rinse liquid to the substrate W is performed. Specifically, in a state where the spin chuck 43a is rotating the substrate W and the entire area of the upper surface of the substrate W is covered by the liquid film of the etching liquid, the rinse liquid valve 45c is opened and the rinse liquid nozzle 45a is made to start discharge of the rinse liquid. The rinse liquid is thereby supplied to the entire area of the upper surface of the substrate W and the etching liquid on the substrate W is rinsed off.

When a predetermined time elapses from when the supply of the rinse liquid was started, the rinse liquid valve 45c is closed. Thereafter, the drying step of drying the substrate W by high speed rotation of the substrate W is performed. Specifically, in a state where the discharge of the rinse liquid from the rinse liquid nozzle 45a is stopped, the electric motor 43d accelerates the substrate W in the rotation direction and rotates the substrate W at a high rotational speed (for example, of several thousand rpm) that is greater than a rotational speed of the substrate W from the etching step to the rinsing step. Thereby, liquid is removed from the substrate W and the substrate W dries. When a predetermined time elapses from when the high speed rotation of the substrate W was started, the electric motor 43d stops the rotation.

After the rotation of the substrate W has been stopped, all guards 47 are disposed at the lower positions. In this state, the entrance/exit is opened and the center robot CR makes the hand Hc enter inside the etching processing unit 2e. The center robot CR moves the hand Hc to support the substrate W on the spin chuck 43a by the hand Hc. Thereafter, the center robot CR moves the hand Hc out of the etching processing unit 2e through the entrance/exit. The substrate W is thereby carried out from the etching processing unit 2e.

In the example shown in FIG. 4, the etching liquid and the rinse liquid are both pure water. In this case, the drying step may be performed without performing the rinsing step or the drying step may be performed after rinsing off the pure water as the etching liquid with the pure water as the rinse liquid. In the former case, the electric motor 43d should rotate the substrate W at the high rotational speed in a state where there is etching liquid on the substrate W. In the following, an example where, after the etching step has been performed, the drying step is performed without performing the rinsing step.

Next, an electrical arrangement of the substrate processing apparatus 1 will be described.

Figures 5, 6:
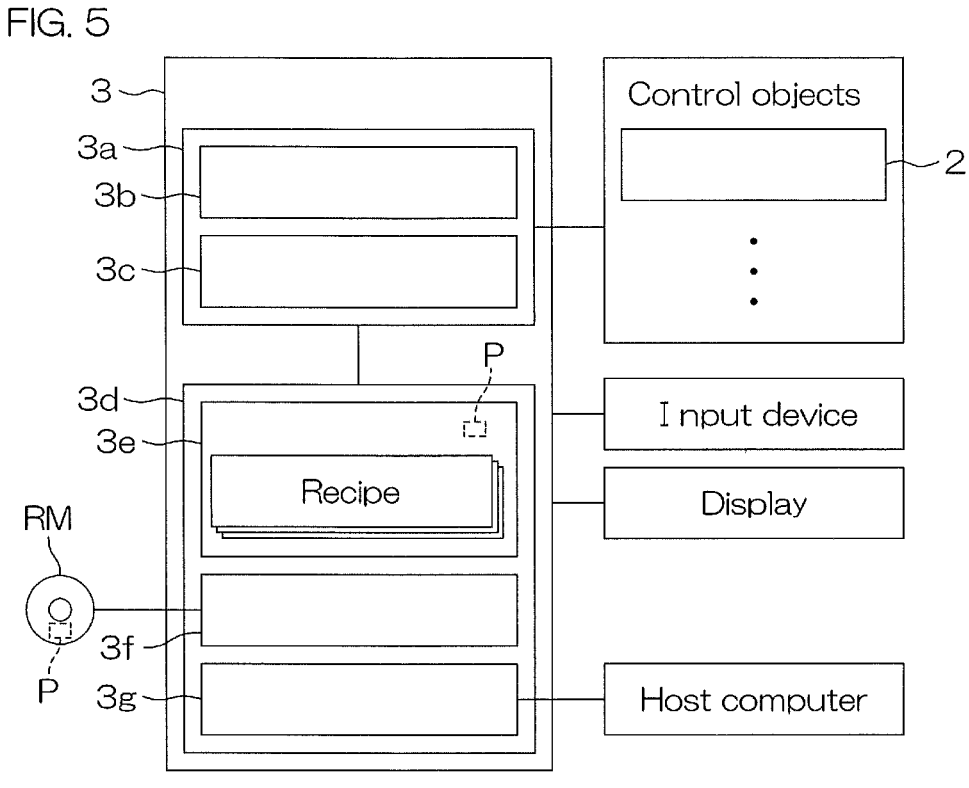
FIG. 5 is a block diagram showing an electrical arrangement of the substrate processing apparatus.
FIG. 6 is a table showing an example of the numbers of times of a high temperature cycle and a low temperature cycle and an order of the high temperature cycles and the low temperature cycles.

FIG. 5 is a block diagram showing the electrical arrangement of the substrate processing apparatus 1. The controller 3 is a computer that includes a computer main body 3a and a peripheral device 3d that is connected to the computer main body 3a. The computer main body 3a includes a CPU 3b (central processing unit) that executes various types of commands and a memory 3c that stores information. The peripheral device 3d includes a storage 3e that stores information such as a program P, a reader 3f that reads information from a removable medium RM and a communication device 3g that communicates with other devices such as a host computer.

The controller 3 is connected to an input device and a display. The input device is operated when an operator such as a user or a maintenance operator inputs information to the substrate processing apparatus 1. The information is displayed on the screen of the display. The input device may be any one of a keyboard, a pointing device and a touch panel or may be a device other than those. A touch panel display that serves both as the input device and the display may be provided in the substrate processing apparatus 1.

The CPU 3b executes the program P stored in the storage 3e. The program P within the storage 3e may be previously installed in the controller 3, may be fed through the reader 3f from the removable medium RM to the storage 3e or may be fed from an external device such as the host computer to the storage 3e through the communication device 3g.

The storage 3e and the removable medium RM are nonvolatile memories that retain memory even without power being supplied. The storage 3e is, for example, a magnetic storage device such as a hard disk drive. The removable medium RM is, for example, an optical disc such as a compact disc or a semiconductor memory such as a memory card. The removable medium RM is an example of a computer readable recording medium in which the program P is recorded. The removable medium RM is a non-transitory tangible recording medium.

The storage $3e$ stores a plurality of recipes. The recipe is information that specifies the details of processing, processing conditions and processing procedures of the substrate W. A plurality of recipes differ from each other in at least one of the details of processing, the processing conditions and the processing procedures of the substrate W. The controller 3 controls the substrate processing apparatus 1 such that the substrate W is processed according to the recipe designated by the host computer. The controller 3 is programmed to execute the individual steps described below.

Next, an example of processing of the substrate W performed by the substrate processing apparatus 1 shall be described.

FIG. 6 is a table TB showing an example of the numbers of times of a high temperature cycle and a low temperature cycle and an order of the high temperature cycles and the low temperature cycles. In FIG. 6, a high temperature cycle is expressed by "H" and low temperature cycle is expressed by "L." In the example of the processing of the substrate W described below, the high temperature cycle is performed N times and the low temperature cycle is performed M times on the single substrate W (N and M are both integers not less than 2). N may be equal to M or may be greater than or less than M.

The high temperature cycle includes a high temperature oxidation step and the etching step. The high temperature oxidation step is an oxidation step in which the substrate W is heated at a high temperature by irradiation of light while supplying the ozone gas to the substrate W. The low temperature cycle includes a low temperature oxidation step and the etching step. The low temperature oxidation step is an oxidation step in which the substrate W is heated at a low temperature, lower than the temperature (high temperature) of the substrate W in the high temperature oxidation step, by irradiation of light while supplying the ozone gas to the substrate W.

The high temperature oxidation step and the low temperature oxidation step are an example of a first oxidation step and a second oxidation step. Either of the high temperature oxidation step and the low temperature oxidation step may be the first oxidation step. The etching step performed after the first oxidation step is a first etching step and the etching step performed after the second oxidation step is a second etching step. One of the high temperature cycle and the low temperature cycle is a first cycle and the other of the high temperature cycle and the low temperature cycle is a second cycle.

N that expresses the number of times of the high temperature cycle, M that expresses the number of times of the low temperature cycle, and the order of the high temperature cycles and the low temperature cycles are designated in a recipe. N and M are set in accordance with a total removal amount that expresses a difference between a thickness of the molybdenum film 100 (see FIG. 1A) before the first cycle is performed and the thickness of the molybdenum film 100 after all cycles have been performed. If Tn and Tm are respectively defined as a decrease amount of the thickness of the molybdenum film 100 when a single high temperature cycle has been performed and a decrease amount of the thickness of the molybdenum film 100 when a single low temperature cycle has been performed, the total removal amount is expressed as: total removal amount=Tn× N+Tm×M.

As long as the total removal amount is the same, the numbers of times of the high temperature cycle and the low temperature cycle and the order of the high temperature cycles and the low temperature cycles may be set in any way. Cases 1 to 5 in FIG. 6 show specific examples of the numbers of times of the high temperature cycle and the low temperature cycle and the order of the high temperature cycles and the low temperature cycles.

Cases 1 to 3 in FIG. 6 show examples that are the same in the numbers of times of the high temperature cycle and the low temperature cycle and differ in the order of the high temperature cycles and the low temperature cycles. As shown by case 1, the high temperature cycle may be performed N times first and the low temperature cycle may be performed M times thereafter. Oppositely, as shown by case 2, the low temperature cycle may be performed M times first and the high temperature cycle may be performed N times thereafter. As shown by case 3, the high temperature cycle and the low temperature cycle may be performed alternately once at a time. If in case 3, N is greater than M, the high temperature cycle should be performed at least either before or after performing the high temperature cycle and the low temperature cycle alternately. The same applies when M is greater than N in case 3.

When, as shown in case 4 of FIG. 6, the high temperature cycle is performed three times or more, the number of times of the low temperature cycle performed between two high temperature cycles may differ each time. Case 4 shows an example where the low temperature cycle is performed once between the high temperature cycles of the first time and the second time, the low temperature cycle is performed twice between the high temperature cycles of the second time and the third time, and the low temperature cycle is performed three times between the high temperature cycles of the third time and the fourth time. In case 4, the high temperature cycles and the low temperature cycles may be interchanged.

When, as shown in case 5 of FIG. 6, the high temperature cycle is performed four times or more, the number of times of the low temperature cycle performed between two high temperature cycles may differ each time in a plurality of intervals less than a total number of intervals between the high temperature cycles. In case 5, the total number of intervals between the high temperature cycles is 3. Case 5 shows an example where the low temperature cycle is performed once between the high temperature cycles of the first time and the second time, the low temperature cycle is performed twice between the high temperature cycles of the second time and the third time, and the low temperature cycle is performed once between the high temperature cycles of the third time and the fourth time. The number of times of the low temperature cycle differs between the first and second intervals and between the second and third intervals. In case 5, the high temperature cycles and the low temperature cycles may be interchanged.

The number of times of the low temperature cycle performed between a high temperature cycle and the next high temperature cycle may be the same each time as shown in case 3 of FIG. 6 or may change regularly or irregularly as shown in case 4 and case 5 of FIG. 6. The same applies when the high temperature cycles and the low temperature cycles are interchanged. When a plurality of the substrates W are processed, as long as the numbers of times of the high temperature cycle and the low temperature cycle are the same, the number of times the low temperature cycle is performed between two high temperature cycles may be the same each time in the processing of a certain substrate W and the number of times the low temperature cycle is performed between two high temperature cycles may change regularly or irregularly in the processing of another substrate W.

Figures 7A, 7B:
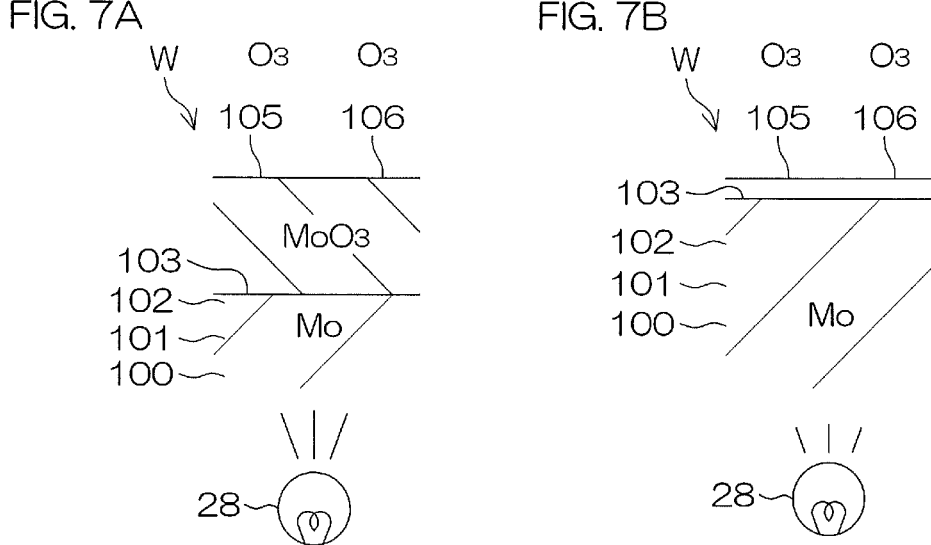
FIGS. 7A and 7B are each a schematic sectional view showing an example of the cross section of the substrate after a high temperature oxidation step or a low temperature oxidation step has been performed.
Figure 8:
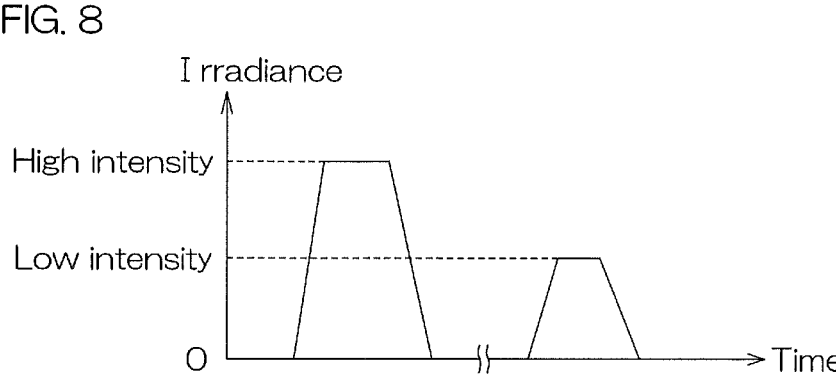
FIG. 8 is a graph showing a change with time of an intensity of light when the high temperature oxidation step and the low temperature oxidation step are being performed.
Figure 9:
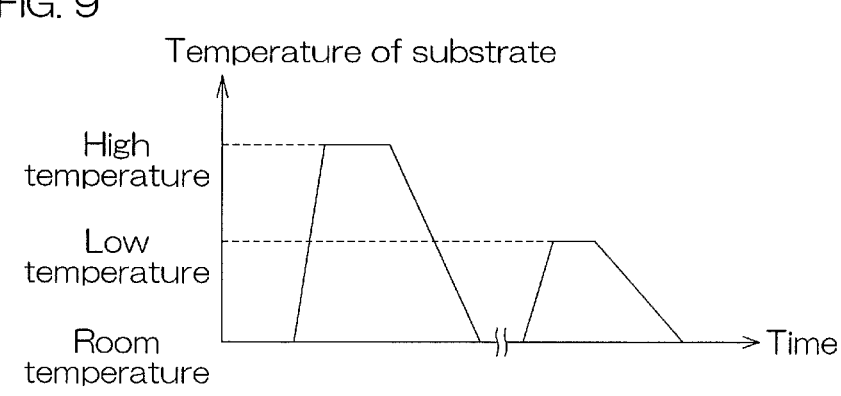
FIG. 9 is a graph showing a change with time of a temperature of the substrate when the high temperature oxidation step and the low temperature oxidation step are being performed.

FIG. 7A and FIG. 7B are each a schematic sectional view showing an example of the cross section of the substrate W after the high temperature oxidation step or the low temperature oxidation step has been performed. FIG. 7A shows the example of the cross section of the substrate W after the high temperature oxidation step has been performed and FIG. 7B shows the example of the cross section of the substrate W after the low temperature oxidation step has been performed. FIG. 8 is a graph showing a change with time of the intensity of light when the high temperature oxidation step and the low temperature oxidation step are being performed. FIG. 9 is a graph showing a change with time of the temperature of the substrate W when the high temperature oxidation step and the low temperature oxidation step are being performed.

As described above, the high temperature oxidation step is an oxidation step in which the substrate W is heated at the high temperature by irradiation of light while supplying the ozone gas to the substrate W. The low temperature oxidation step is an oxidation step in which the substrate W is heated at the low temperature by irradiation of light while supplying the ozone gas to the substrate W. As shown in FIG. 9, the low temperature is lower than the high temperature. The low temperature and the high temperature are temperatures within the range from the minimum temperature to the maximum temperature described above.

When the high temperature oxidation step is performed, the intensity control circuit 29 (see FIG. 3) makes the LED lamps that are an example of the heating lamps 28 emit light of high intensity corresponding to the high temperature. As shown in FIG. 9, the light of high intensity is irradiated on the substrate W and raises the temperature of the substrate W to the high temperature. The temperature of the substrate W can thereby be maintained at the high temperature while supplying the ozone gas to the substrate W.

On the other hand, when the low temperature oxidation step is performed, the intensity control circuit 29 makes the LED lamps that are an example of the heating lamps 28 emit light of low intensity corresponding to the low temperature. As shown in FIG. 9, the light of low intensity is irradiated on the substrate W and raises the temperature of the substrate W to the low temperature. The temperature of the substrate W can thereby be maintained at the low temperature while supplying the ozone gas to the substrate W.

The temperature of the substrate W depends on the intensity of the light irradiated on the substrate W. As shown in FIG. 8, the light of high intensity mentioned above is light of higher irradiance than the light of low intensity mentioned above. The light of high intensity mentioned above is, for example, light with a wavelength within a range of 300 to 1000 nm and an irradiance of not less than 10 $W/cm^2$ and heats the substrate W at a rate of not less than 50° C./second. As can be understood from a comparison of FIG. 7A and FIG. 7B, a thicker molybdenum oxide film 105 is formed in the high temperature oxidation step than in the low temperature oxidation step. The decrease amount of the thickness of the molybdenum film 100 when a single high temperature cycle has been performed is therefore greater than the decrease amount of the thickness of the molybdenum film 100 when a single low temperature cycle has been performed.

Figure 10:
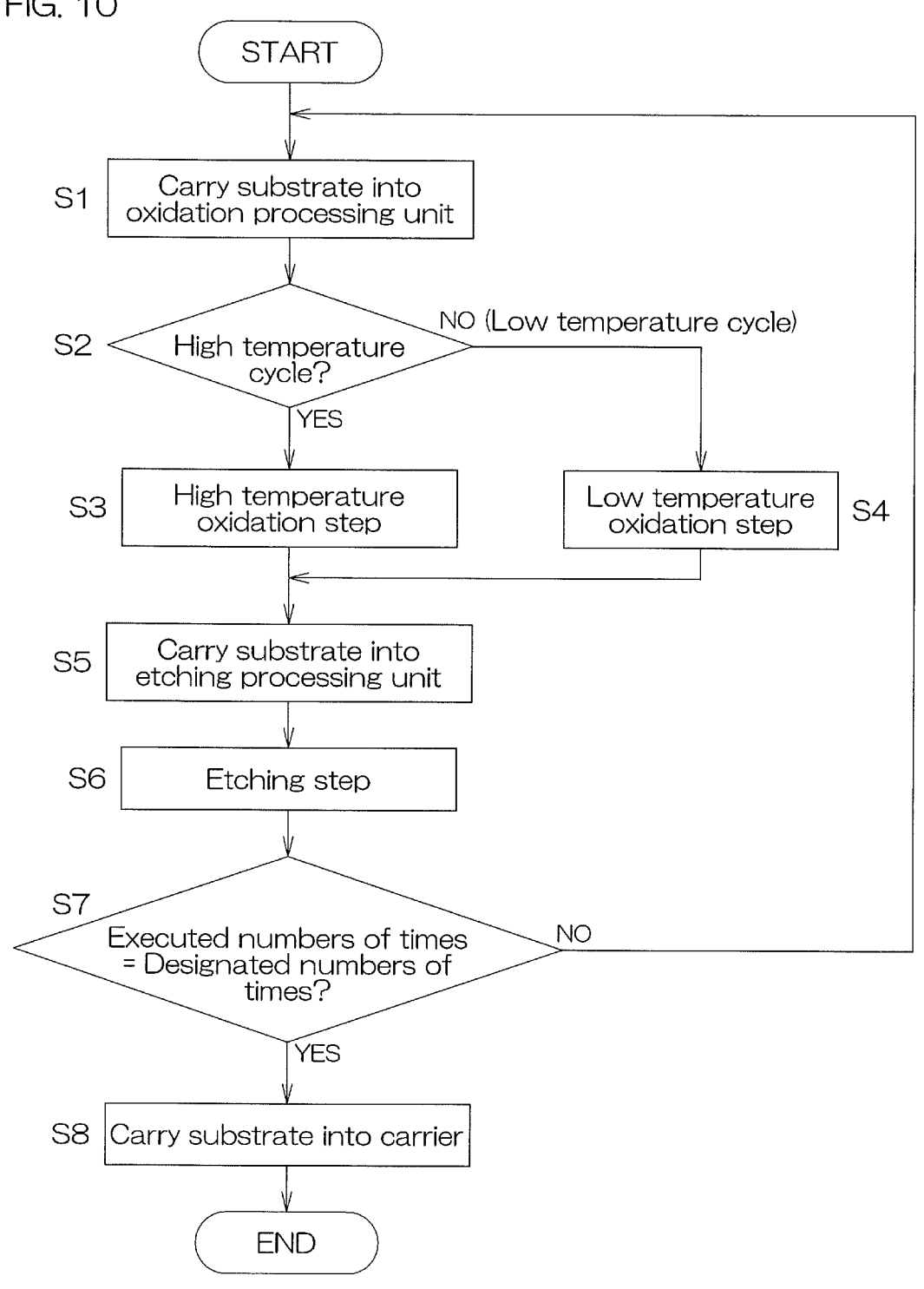
FIG. 10 is a flowchart for describing an example of processing of a substrate according to a preferred embodiment of the present invention.

FIG. 10 is a flowchart for describing an example of processing of the substrate W according to a preferred embodiment of the present invention. In the following, FIG. 2 and FIG. 10 shall be referenced.

When the substrate W is to be processed by the substrate processing apparatus 1, the substrate W is carried into the oxidation processing unit 2o (step S1 of FIG. 10). If it is designated by the recipe to perform the high temperature cycle (Yes in step S2 of FIG. 10), the high temperature oxidation step is performed in the oxidation processing unit 2o (step S3 of FIG. 10). If it is designated by the recipe to perform the low temperature cycle (No in step S2 of FIG. 10), the low temperature oxidation step is performed in the oxidation processing unit 2o (step S4 of FIG. 10).

After the high temperature oxidation step or the low temperature oxidation step has been performed, the substrate W is carried out from the oxidation processing unit 2o and the substrate W that has been carried out is carried into the etching processing unit 2e (step S5 of FIG. 10). Thereafter, the etching step and the drying step are performed in the etching processing unit 2e (step S6 of FIG. The molybdenum oxide film 105 (see FIG. 1B) formed in the high temperature oxidation step or the low temperature oxidation step is thereby removed.

After the etching step and the drying step have been performed, whether or not the numbers of times the high temperature cycle and the low temperature cycle have been performed match the numbers of times designated by the recipe is checked (step S7 of FIG. 10). If there is no match (No in step S7 of FIG. 10), the substrate W is carried out from the etching processing unit 2e and the substrate W that has been carried out is carried into an oxidation processing unit 2o that is the same as or differs from that of the previous time (step S1 of FIG. 10).

After the substrate W has been carried into the oxidation processing unit 2o, the high temperature oxidation step or the low temperature oxidation step is performed in accordance with the designation of the recipe (step S3 or step S4 of FIG. 10) and then the substrate W that has been carried out from the oxidation processing unit 2o is carried into an etching processing unit 2e that is the same as or differs from that of the previous time (step S5 of FIG. 10). Thereafter, the etching step and the drying step are performed in the etching processing unit 2e (step S6 of FIG. 10).

The steps from step S1 to step S6 are thus repeated and the high temperature cycle and the low temperature cycle are performed in the order designated in the recipe and for the numbers of times designated by the recipe. When, the numbers of times the high temperature cycle and the low temperature cycle have been performed match the numbers of times designated by the recipe (Yes in step S7 of FIG. 10), the substrate W is carried out from the etching processing unit 2e and the substrate W that has been carried out is carried into a carrier CA on a load port LP (step S8 of FIG. 10).

As described above, with the present preferred embodiment, the substrate W is heated by irradiating the substrate W with light. Further, the oxygen gas or the ozone gas is supplied to the substrate W while irradiating the substrate W with light. Thereby, oxygen atoms contained in the oxygen gas or the ozone gas bond with molybdenum and the surface layer 102 of the molybdenum film 100 changes to molybdenum trioxide. Thereafter, the etching liquid is supplied to the substrate W. The molybdenum trioxide dissolves in the etching liquid. Therefore, the surface layer 102 of the molybdenum film 100 that has changed to the molybdenum trioxide is etched while the portion other than the surface layer 102 of the molybdenum film 100 that has not changed to the molybdenum trioxide remains on the substrate W.

The thickness of the molybdenum oxide film 105 that is formed by the change to the molybdenum trioxide depends on the temperature of the substrate W when the oxygen gas or the ozone gas is being supplied. For example, when the temperature of the substrate W is raised, the thickness of the molybdenum oxide film 105 increases and the thickness of the molybdenum film 100 decreases. If, when the surface layer 102 of the molybdenum film 100 is oxidized a plurality of times, the substrate W is heated at a high temperature each time, although a rate at which the molybdenum film 100 thins increases, it is difficult to control the thickness of the molybdenum film 100 finely. On the other hand, if the substrate W is heated at a low temperature each time, although the thickness of the molybdenum film 100 can be controlled finely readily, the rate at which the molybdenum film 100 thins decreases.

With the present preferred embodiment, when the surface layer 102 of the molybdenum film 100 is to be oxidized, the temperature of the substrate W is changed by changing the intensity of light irradiated on the substrate W. Therefore, in comparison to the case where the substrate W is heated at a high temperature each time, the thickness of the molybdenum film 100 can be controlled finely. In addition, in comparison to the case where the substrate W is heated at a low temperature each time, the rate at which the molybdenum film 100 thins can be increased. Thereby, the molybdenum film 100 can be thinned in a shorter time while maintaining dimensional precision of the molybdenum film 100.

With the present preferred embodiment, the substrate W is heated by irradiating the substrate W with light emitted from the LED lamps that are an example of the heating lamps 28. Therefore, in comparison to the case of heating the substrate W with a hotplate, that is, in comparison to a case of transferring Joule heat to the substrate W by thermal conduction, the temperature of the substrate W can be raised rapidly. Further, in comparison to a case of heating the substrate W with another heat source such as a hotplate, a halogen lamp, etc., power consumption can be reduced. In addition, the LED lamps are long in service life and therefore, a frequency of replacement of components can be decreased in comparison to the case of heating the substrate W with another heating lamp such as a halogen lamp, etc.

With the present preferred embodiment, the LED lamps are made to emit the light of the wavelength within the range of 300 to 1000 nm. If a temperature of the silicon wafer is not more than 500° C. and the wavelength of the light exceeds the above range, absorptivity of the light by the silicon wafer is low and therefore, the temperature of the substrate W cannot be raised rapidly unless the substrate W is irradiated with light of high intensity. If the intensity of the light is increased, the power consumption increases and the need to use larger heating lamps arises. By irradiating the substrate W with the light of the wavelength within the above range, the absorptivity of the light can be made high and the substrate W can be heated efficiently.

With the present preferred embodiment, instead of making a second heating lamp, differing from a first heating lamp emitting the light of the first intensity, emit the light of the second intensity, a single heating lamp 28 is made to emit the light of the first intensity and made to emit the light of the second intensity therebefore or thereafter. That is, the heating lamp 28 is made to emit the light of the first intensity and the light of the second intensity by switching the intensity of the light emitted from the heating lamp 28. The number of heating lamps 28 can thus be decreased in comparison to a case of providing the first heating lamp and the second heating lamp that differ from each other.

With the present preferred embodiment, after heating the substrate W while supplying the oxygen gas or the ozone gas to the substrate W, the etching liquid is supplied to the substrate W. Thereafter, the substrate W is heated while supplying the oxygen gas or the ozone gas to the substrate W and then the etching liquid is supplied to the substrate W again. That is, the oxidation of the molybdenum film 100 and the etching of the molybdenum oxide film 105 are repeated alternately the plurality of times. Thereby, the thickness of the molybdenum film 100 can be decreased in steps and the thickness of the molybdenum film 100 can be adjusted in steps.

With the present preferred embodiment, the first cycle of heating the substrate W at the first temperature by irradiation of the light of the first intensity while supplying the oxygen gas or the ozone gas to the substrate W and thereafter supplying the etching liquid to the substrate W is performed three times or more. Further, the second cycle of heating the substrate W at the second temperature by irradiation of the light of the second intensity while supplying the oxygen gas or the ozone gas to the substrate W and thereafter supplying the etching liquid to the substrate W is performed once or more. One of the high temperature cycle and the low temperature cycle is the first cycle and the other of the high temperature cycle and the low temperature cycle is the second cycle.

The number of times of the second cycle performed between two first cycles differs in each of the plurality of intervals not more than the total number of intervals between the first cycles. For example, if the first cycle is performed three times, the second cycle is performed once between the first cycles of the first time and the second time and the second cycle is performed twice between the first cycles of the second time and the third time. If the first cycle is performed four times, the second cycle is performed once between the first cycles of the first time and the second time and the second cycle is performed twice between the first cycles of the second time and the third time. The number of times of the second cycle performed between the first cycles of the third time and the fourth time may be 1 or 2 or may be zero or a value not less than 3.

If, when the first cycle is performed individually on a plurality of substrates W, timings at which the first cycle is performed overlap, a usage amount of a processing fluid such as a processing gas, a processing liquid, etc., or a usage amount of electric power increases focally at times. By changing the number of times of the second cycle performed between two first cycles, such focal increase can be made small and the usage amount per time of the processing fluid or electric power can be leveled out.

With the present preferred embodiment, the substrate W is heated while supplying not the oxygen gas but the ozone gas to the substrate W. Therefore, in comparison to a case of heating the substrate W while supplying the oxygen gas to the substrate W, the surface layer 102 of the molybdenum film 100 can be changed to the molybdenum trioxide efficiently. Thereby, a time for changing the surface layer 102 of the molybdenum film 100 to the molybdenum trioxide can be shortened and a throughput (number of substrates W processed per unit time) of the substrate processing apparatus 1 can be increased.

With the present preferred embodiment, a water-containing liquid having water as the main component is supplied to the substrate W to etch the substrate W. Whereas the molybdenum trioxide dissolves in water, the molybdenum does not dissolve or hardly dissolves in water. The surface layer 102 of the molybdenum film 100 that has changed to the molybdenum trioxide can therefore be removed from the substrate W without using a chemical liquid. Thereby, treatment of waste liquid can be simplified and a load on the environment can be lightened in comparison to a case where the etching liquid is a chemical liquid.

With the present preferred embodiment, the molybdenum film 100 is oxidized and etched inside the single substrate processing apparatus 1. In other words, after the substrate W has been carried into the substrate processing apparatus 1 through a load port LP, the substrate W is not carried out from the substrate processing apparatus 1 through the load port LP until the oxidization of the molybdenum film 100 and the etching of the molybdenum oxide film 105 are ended. Therefore, in comparison to a case where the oxidation of the molybdenum film 100 and the etching of the molybdenum oxide film 105 are performed in separate substrate processing apparatuses, time required for transfer of the substrate W can be shortened.

Other Preferred Embodiments

The oxidation step may include three or more oxidation steps that differ in set temperature of the substrate W. For example, the oxidation step may include, in addition to the high temperature oxidation step and the low temperature oxidation step, an intermediate temperature oxidation step in which the substrate W is heated at an intermediate temperature, lower than the high temperature and higher than the low temperature, by irradiation of light of an intermediate intensity weaker than the high intensity and stronger than the low intensity while supplying the oxygen gas or the ozone gas to the substrate W.

Instead of performing the high temperature oxidation step and the low temperature oxidation step by changing the intensity of the light emitted from the heating lamps 28 between the high intensity and the low intensity, a high intensity heating lamp that irradiates the substrate W with light of the high intensity and a low intensity heating lamp that irradiates the substrate W with light of the low intensity may be provided. In this case, the high intensity heating lamp and the low intensity heating lamp may be disposed inside the same oxidation processing unit 2o or may be disposed inside separate oxidation processing units 2o.

Instead of performing the spin drying of drying the substrate W by high speed rotation of the substrate W, the liquid adhered to the substrate W may be replaced by a liquid of IPA or other organic solvent of higher volatility than water by supplying a vapor of the organic solvent to the substrate W. In addition thereto or in place thereof, evaporation of the liquid adhered to the substrate W may be promoted by decreasing a gas pressure inside the space in which the substrate W to be dried is disposed.

If an amount by which the thickness of the molybdenum film 100 is to be decreased is small, the numbers of times of the high temperature cycle and the low temperature cycle performed on the single substrate W may be once each.

Instead of oxidizing a plurality of substrates W one at a time, the plurality of substrates W may be oxidized in a batch. That is, the plurality of substrates W may be heated at the same time by irradiation of light while supplying the oxygen gas or the ozone gas to the plurality of substrates W at the same time. In a case of oxidizing the plurality of substrates W in a batch, the plurality of substrates W may be etched one at a time or the plurality of substrates W may be etched in a batch. In a case of etching the plurality of substrates W in a batch, the plurality of substrates W may be oxidized one at a time.

Instead of performing all of the high temperature cycle and the low temperature cycle in the substrate processing apparatus 1, a portion of steps included in the high temperature cycle and the low temperature cycle may be performed in a separate substrate processing apparatus. For example, the high temperature oxidation step and the low temperature oxidation step may be performed in the substrate processing apparatus 1 and the etching step may be performed in the separate substrate processing apparatus. Or, the high temperature cycle that includes the high temperature oxidation step and the etching step may be performed in the substrate processing apparatus 1 and the low temperature cycle that includes the low temperature oxidation step and the etching step may be performed in the separate substrate processing apparatus.

The substrate processing apparatus 1 is not restricted to an apparatus to process a disc-shaped substrate W, and may be an apparatus to process a polygonal substrate W.

Two or more arrangements among all the arrangements described above may be combined. Two or more steps among all the steps described above may be combined.

The oxidation processing unit 2o is an example of first and second oxidation units. The gas supply port 31a is an example of first and second gas supply ports. The heating lamps 28 are an example of first and second heating lamps. The etching processing unit 2e is an example of first and second etching processing units. The etching liquid nozzle 44a is an example of first and second etching liquid nozzles.

The preferred embodiments of the present invention are described in detail above, however, these are just detailed examples used for clarifying the technical contents of the present invention, and the present invention should not be limitedly interpreted to these detailed examples, and the spirit and scope of the present invention should be limited only by the claims appended hereto.

What is claimed is:

1. A substrate processing method comprising:
   a first oxidation step that includes supplying an oxygen gas or an ozone gas to a substrate and irradiating the substrate with light of a first intensity to heat the substrate at a first temperature and that changes a surface layer of a molybdenum film formed on the substrate to molybdenum trioxide without changing a portion other than the surface layer of the molybdenum film to the molybdenum trioxide by supplying the oxygen gas or the ozone gas to the substrate and irradiating the substrate with the light of the first intensity at the same time;
   supplying an etching liquid to the substrate to make the surface layer that changed to the molybdenum trioxide in the first oxidation step dissolve in the etching liquid while leaving, on the substrate, the portion other than the surface layer of the molybdenum film;
   a second oxidation step that includes supplying the oxygen gas or the ozone gas to the substrate and irradiating the substrate with light of a second intensity stronger or weaker than the first intensity to heat the substrate at a second temperature higher or lower than the first temperature and that changes the surface layer of the molybdenum film to the molybdenum trioxide without changing the portion other than the surface layer of the molybdenum film to the molybdenum trioxide by supplying the oxygen gas or the ozone gas to the substrate and irradiating the substrate with the light of the second intensity at the same time before or after the first oxidation step and supplying the etching liquid to the substrate; and supplying the etching liquid to the substrate to make the surface layer that changed to the molybdenum trioxide in the second oxidation step dissolve in the etching liquid while leaving, on the substrate, the portion other than the surface layer of the molybdenum film.

2. The substrate processing method according to claim 1, wherein at least one of irradiating the substrate with the light of the first intensity and irradiating the substrate with the light of the second intensity comprises is a step of irradiating the substrate with light emitted from an LED (light emitting diode) lamp.

3. The substrate processing method according to claim 2, wherein the substrate includes a silicon wafer and the molybdenum film held by the silicon wafer and the wavelength of the light emitted from the LED lamp is within a range of 300 to 1000 nm.

4. The substrate processing method according to claim 1, wherein irradiating the substrate with the light of the first intensity includes making a heating lamp emit the light of the first intensity to irradiate the substrate with the light of the first intensity and the substrate processing method further comprises: making the heating lamp emit the light of the second intensity.

5. The substrate processing method according to claim 1, wherein at least one of a single first cycle that includes the first oxidation step and supplying the etching liquid to the substrate and a single second cycle that includes the second oxidation step and supplying the etching liquid to the substrate is performed a plurality of times.

6. The substrate processing method according to claim 5, wherein if the first cycle is performed three times or more, the number of times of the second cycle performed between the first cycle and the next first cycle differs in each of a plurality of intervals not more than a total number of intervals between the first cycles.

7. The substrate processing method according to claim 1, wherein supplying the oxygen gas or the ozone gas to the substrate comprises supplying the ozone gas to the substrate.

8. The substrate processing method according to claim 1, wherein the etching liquid is a water-containing liquid having water as a main component.

9. The substrate processing method according to claim 1, wherein the first oxidation step, the second oxidation step, and supplying the etching liquid to the substrate are performed inside a single substrate processing apparatus.

* * * * *